US007649763B2

(12) United States Patent
Takashima

(10) Patent No.: US 7,649,763 B2
(45) Date of Patent: Jan. 19, 2010

(54) NONVOLATILE FERROELECTRIC MEMORY

(75) Inventor: Daisaburo Takashima, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 265 days.

(21) Appl. No.: 11/689,725

(22) Filed: Mar. 22, 2007

(65) Prior Publication Data

US 2007/0236979 A1   Oct. 11, 2007

(30) Foreign Application Priority Data

Apr. 6, 2006   (JP)   ............... 2006-105739

(51) Int. Cl.
*G11C 11/22* (2006.01)
(52) U.S. Cl. .................. 365/145; 365/65; 257/245
(58) Field of Classification Search ............ 365/203, 365/205, 207, 145, 65, 117; 327/50–57; 257/245
See application file for complete search history.

(56) References Cited

U.S. PATENT DOCUMENTS

| 5,874,760 | A | * | 2/1999 | Burns et al. ............ 257/315 |
| 5,903,492 | A |  | 5/1999 | Takashima |
| 2002/0066914 | A1 | * | 6/2002 | Imai et al. ............ 257/295 |

FOREIGN PATENT DOCUMENTS

| JP | 10-255483 | 9/1998 |
| JP | 11-177036 | 7/1999 |
| JP | 2000-22010 | 1/2000 |

OTHER PUBLICATIONS

A Survey of Circuit Innovations in Ferroelectric Random-Access Memories, A. Sheikholeslami, et al.,Proceedings of the IEEE, vol. 88, No. 5, May 2000, pp. 667-689.*
J.T. Evans et al, "An Experimental 512-bit Nonvolatile Memory with Ferroelectric Storage Cell," IEEE Journal of Solid-State Circuits, vol. 23, No. 5, Oct. 1988, pp. 1171-1175.
T. Nishihara et al, "A Quasi-Matrix Ferroelectric Memory for Future Silicon Storage," IEEE Journal of Solid-State Circuits, vol. 37, No. 11, Nov. 2002, pp. 1479-1484.

* cited by examiner

*Primary Examiner*—Son Dinh
*Assistant Examiner*—Harry W Byrne
(74) *Attorney, Agent, or Firm*—Oblon, Spivak, McClelland, Maier & Neustadt, L.L.P.

(57) ABSTRACT

According to an aspect of the invention, there is provided a nonvolatile ferroelectric memory, including a ferroelectric capacitor composed of a ferroelectric film sandwiched by capacitor electrodes made of a conductive material, a cell capacitor block stacked a plurality of the capacitor electrodes and the ferroelectric film of the ferroelectric capacitor perpendicular to a main surface of a silicon substrate in layer, a cell transistor having a drain electrode and a source electrode, the drain electrode and the source electrode are electrically connected to the ferroelectric capacitor in parallel, a memory cell composed of the ferroelectric capacitor and the cell transistor, a cell block having the plurality of memory cells electrically connected in series, the drain electrode and the source electrode being as a terminals, a word line, a bit line connected to one end of the cell block, the bit line being arranged along orthogonal direction to the word line and a plate line connected to the other end of the cell block, the plate line arranged along the word line.

7 Claims, 15 Drawing Sheets

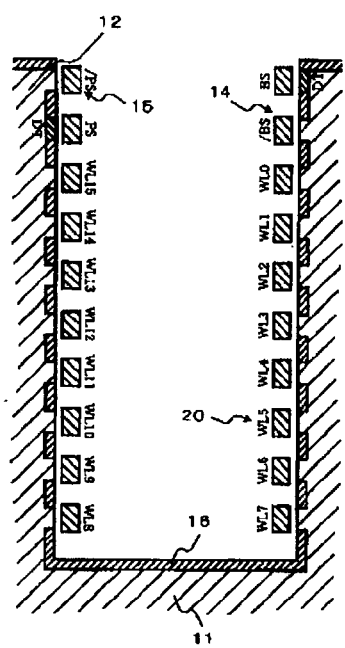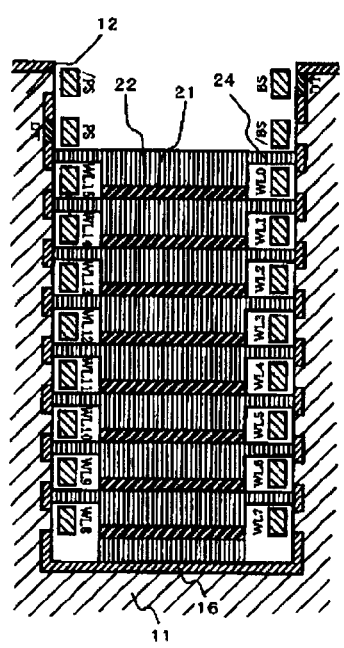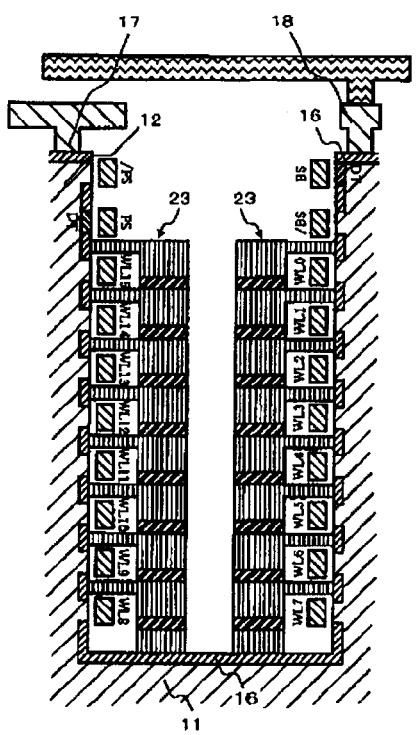
FIG. 8 A  FIG. 8 B  FIG. 8 C

NONVOLATILE FERROELECTRIC MEMORY

CROSS REFERENCE TO RELATED APPLICATION

This application is based upon and claims the benefit of priority from the prior Japanese Application (No. 2006-105739, filed on Apr. 6, 2006), the entire contents of which are incorporated herein by reference.

FIELD OF THE INVENTION

The present invention relates to a nonvolatile ferroelectric memory, and in particular, to an arrangement of memory cells in the nonvolatile ferroelectric memory.

DESCRIPTION OF THE BACKGROUND

Today, a semiconductor memory is used in various commercial products, such as a main memory of both large-sized computer and personal computer, a home electric appliance, a cellular phone and the like. As a kind of semiconductor memory, a volatile DRAM (Dynamic RAM), a volatile SRAM (Static RAM), a nonvolatile MROM (Mask ROM), a nonvolatile flash EEPROM (flash memory) and the like have come out as a device product. Especially, the DRAM, in spite of the volatile memory, is superior to another memory from view points of a lower cost and a higher speed. For example, a cell area of the DRAM is ¼ as compared with that of the SRAM and a speed of the DRAM as device performance is higher than that of the flash memory. Therefore, the DRAM largely occupies in the present semiconductor memory market. On the other hand, the flash memory is rewritable and nonvolatile, and power supplied to the flash memory can be switched off, however, rewriting number (W/E) of the flash memory is approximately $10^6$ and writing time of the flash memory takes approximately micro seconds. Furthermore, the flash memory has to be applied to high voltage (12V-22V) in a writing process. These shortages lead the flash memory to fewer commercial products as compared with the DRAM.

On the other hand, a nonvolatile ferroelectric memory using a ferroelectric capacitor was proposed in 1980. Since then, as the nonvolatile ferroelectric memory has advantages such as nonvolatile property, W/E number being approximately $10^{12}$, a reading time and a writing time being nearly the same as those of the DRAM, an operation in 3V-5V and the like, it has been developed by many electronics manufacturers. The nonvolatile ferroelectric memory has capability of replacing all the commercial products in the memory market.

Conventionally, for example, as J. T. Evans et al., described in "An experimental 512k-b nonvolatile memory with ferroelectric cell", IEEE Journal Solid-State Circuit, vol. 23, No. 5, pp. 1171-1175, October 1988, the ferroelectric memory cell is constituted of one cell transistor and one ferroelectric capacitor. The cell transistor and the ferroelectric capacitor are connected in series. One memory cell is arranged at two intersections of a word line and a bit line in a folded-bit-line structure of a conventional ferroelectric memory. In the structure, the minimum size of the memory cell is $2F \times 4F = 8F^2$, where a width of an interconnection and a space between interconnections is F. As a result, the miniaturization of the cell size has a restriction.

Moreover, in the conventional memory cell structure, plate lines are divided into each word line and are individually driven in order to prevent destruction of polarization information of a non-selected cell in the ferroelectric capacitor. As a plurality of the ferroelectric capacitors are connected to each of the plate lines along the word line direction, the load capacity of the ferroelectric capacitor become large. Furthermore, as a layout pitch of a plate line drive circuit becomes severe as comparable as the layout pitch of the word line, the layout size of the plate line drive circuit can not be designed comparatively large. For the reason mentioned above, in the conventional ferroelectric memory, delay of the voltage applied to the upper and the lower sides of the plate lines becomes large. As a result, there was a shortage that an operation speed of the ferroelectric memory becomes slow.

In order to cope with such shortages, authors disclose a ferroelectric memory, for example, in Japanese Patent Publications, such as Japanese Patent Publication (Kokai) No. H10-255483, Japanese Patent Publication (Kokai) No. H11-177036, and Japanese Patent Publication (Kokai) No. 2000-22010. The ferroelectric memory can realize three points, (1) a small ferroelectric memory cell of $4F^2$ size (2) a plane transistor being simply fabricated (3) a high speed random access function with versatility. By applying such technology to the ferroelectric memory, the ferroelectric memory cell of a minimum size of $4F^2$ by using the plane transistor can be realized.

However, realization of the memory cell having smaller size than $4F^2$ is principally difficult in the ferroelectric memory, even if these techniques are applied. Furthermore, a multiple value NAND flash memory can perform R/W of data at high speed than the conventional NAND flash memory and substantially realize a cell size below $4F^2$ by memorizing multiple value information in one cell. Therefore, realization of the ferroelectric memory cell exceeding the multiple value NAND flash memory in lower cost is difficult.

On the other hand, there exists a ferroelectric memory constituted of three-dimensional structure. For example, T. Nishihara et al. demonstrated that a transistor is formed on a silicon substrate and a ferroelectric capacitor is stacked in layer in "A quasi-matrix ferroelectric memory for future silicon storage", IEEE Journal Solid-State Circuit, vol. 27, No. 11, pp. 1479-1484, November 2002. The ferroelectric memory having a small size and a large capacity is constituted of a plurality of ferroelectric capacitors stacked in layer.

In the conventional method as described above, the ferroelectric capacitors are simply disposed without being connected by the transistor. When data are both writing in and reading out to/from the ferroelectric capacitor, unnecessary voltage over ⅓ is applied to adjacent non-selective ferroelectric capacitor. This is so called a disturb phenomenon being generated in the non-selective ferroelectric capacitor. This is a serious problem as degradation of a stable operation on the ferroelectric memory. Therefore, the ferroelectric memory has had a difficult problem for practical realization. Accordingly, fabricating of a ferroelectric capacitor being strongly prevented from the disturb phenomenon has been developed as a main subject.

As mentioned above, practical realization of a cell size being smaller than $4F^2$ is difficult in the conventional ferroelectric memory. Further, a three-dimensional ferroelectric memory stacked in layer has a difficulty for practical realization in accordance with the disturb phenomenon.

SUMMARY OF THE INVENTION

According to an aspect of the invention, there is provided a nonvolatile ferroelectric memory, including a ferroelectric capacitor composed of a ferroelectric film sandwiched by capacitor electrodes made of a conductive material, a cell capacitor block stacked the plurality of capacitor electrodes and the ferroelectric film of the ferroelectric capacitor perpendicular to a main surface of a silicon substrate in layer, a cell transistor having a drain electrode and a source electrode, the drain electrode and the source electrode being electrically connected to the ferroelectric capacitor in parallel, a memory cell composed of the ferroelectric capacitor and the cell transistor, a cell block having the plurality of memory cells electrically connected in series, the drain electrode and the source electrode being as a terminals, a word line, a bit line connected to one end of the cell block, the bit line being arranged along orthogonal direction to the word line and a plate line connected to the other end of the cell block, the plate line being arranged along the word line.

Further, another aspect of the invention, there is provided a method for fabricating a nonvolatile ferroelectric memory, including forming silicon pillars, each silicon pillar having a square pole shape, formed on a main surface of a silicon substrate at equal intervals, forming a plurality of vertical MOS transistors on a sidewall of the silicon pillar perpendicular to the silicon substrate so as to connect in series, forming a cell contact connected to a source and a drain of the vertical MOS transistors, the cell contact being in parallel to the silicon substrate, forming a ferroelectric capacitor by interleaving a conductive film as a capacitor electrode and the ferroelectric film in a space between the silicon pillars, the conductive film being connected to the cell contact, selectively removing the conductive film and the ferroelectric film stacked in layer from the top to the bottom, a plate line contact and a bit line contact over the silicon pillars and forming a plate line and a bit line to connect to the plate line contact and the bit line contact.

Further, another aspect of the invention, there is provided a method for fabricating a nonvolatile ferroelectric memory, including forming silicon pillars, each silicon pillar having a square pole shape, on a main surface of a silicon substrate at equal intervals, forming a plurality of vertical MOS transistors on a sidewall of the silicon pillar perpendicular to the silicon substrate so as to connect in series, forming a first conductive film as a capacitor electrode, a ferroelectric film, a second conductive film as the capacitor electrode and a cell contact connected to a source and a drain of the vertical MOS transistor in order, selectively removing the first conductive film, the ferroelectric film and the second conductive film stacked in layer from the top to the bottom, forming a plate line contact and a bit line contact over the silicon pillars and forming a plate line and a bit line so as to connect to the plate line contact and the bit line contact, respectively.

BRIEF DESCRIPTION OF THE DRAWINGS

FIGS. 8A-8C are cross-sectional views showing another processing steps of the memory cell portion of the nonvolatile ferroelectric memory according to the first embodiment of the present invention;

FIG. 12 is a cross-sectional view showing a memory cell portion of a nonvolatile ferroelectric memory according to a third embodiment of the present invention;

FIG. 16 is a cross-sectional view showing a memory cell portion of a nonvolatile ferroelectric memory according to a fifth embodiment of the present invention;

DETAILED DESCRIPTION OF THE INVENTION

Various embodiments of the present invention will be described below in detail with reference to the accompanying drawings.

First Embodiment

Figure 1:
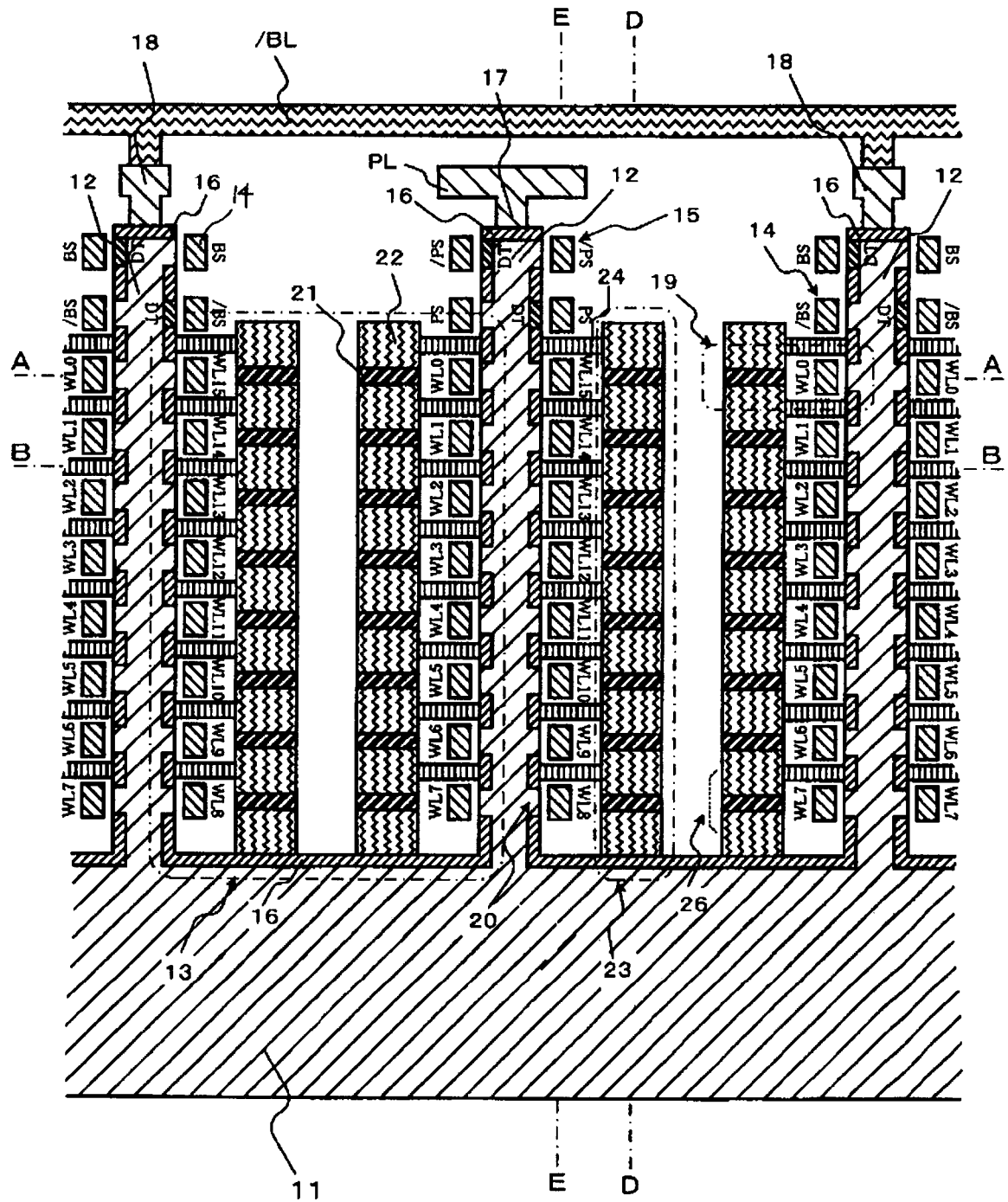
FIG. 1 is a cross-sectional view showing a memory cell portion of a nonvolatile ferroelectric memory according to a first embodiment of the present invention.

First, FIG. 1 is a cross-sectional view showing a memory cell portion of a nonvolatile ferroelectric memory according to a first embodiment of the present invention. Here, FIG. 1 mainly shows a memory cell block constituted of a plurality of ferroelectric memory cells and an interconnection portion related to accessing the memory. Further, a dielectric material of an interlayer dielectric film or the like is fluoroscopically illustrated with omitting description, such as hatching, for avoiding complication in the figure. The same description is also used on a cross-sectional view and a plane view as mentioned below.

The memory cell portion of the nonvolatile ferroelectric memory according to the first embodiment of the present invention includes a plurality of silicon pillars 12, each having a square pole shape. The silicon pillars 12 are formed on a main surface of a silicon substrate 11 at equal intervals. The memory cell portion has a plate line PL disposed over the silicon pillars 12 along a word line direction (perpendicular to the page including FIG. 1), a bit line BL or /BL disposed over the plate line PL along orthogonal direction to the plate line PL (horizontal direction to the page including FIG. 1), a cell block 13 formed in a space between two of the silicon pillars 12 being adjacent each other, a block-selection transistor 14 and a dummy transistor DT of the block-selection transistor 14 configured to an upper sidewall of one of the two silicon pillars 12, and a plate-selection transistor 15 and another dummy transistor DT of the plate-selection transistor 15 configured to an upper sidewall of the other of the two silicon pillars 12. Here, a sign "/" means a complimentary signal and represents that the bit lines BL and /BL are a pair of signal lines.

A diffusion region 16 disposed on an upper surface of the one of the two silicon pillars 12 is electrically connect to the plate line PL via a plate line contact 17 (PL contact 17). Another diffusion region 16 disposed on the upper surface of the other of the two silicon pillar 12 is electrically connected to the bit line BL or /BL via a bit line contact 18 (BL contact 18). The cell block 13 composed of 16 ferroelectric memory cells 19 is formed in the space between the two silicon pillars 12.

One end of the cell block 13 is connect to the diffusion region 16 connecting to the BL contact 18 via the dummy DT and the block-selection transistor 14. The other end of the cell block 13 is connected to the diffusion region 16 connecting to the PL contact 17 via the plate-selection transistor 15 and the DT dummy transistor.

The silicon pillars 12 are form by grooving the main surface of the silicon substrate 11 to form a trench structure, for example. Sixteen cell transistors 20 constituting the cell block 13, the block-selection transistor 14, the dummy transistor DT of the block-selection transistor 14, the plate-selection transistor 15, the dummy transistor DT of the plate-selection transistor 15 are formed on the sidewalls opposed to each other of the silicon pillars 12 being adjacent each other along the bit line direction.

Further, the silicon pillars 12 are formed by 6F interval along the bit line direction, where F is defined as a minimum width of an interconnection and a space between interconnections in the processing steps.

The plate-selection transistor 15 connects the cell block 13 to the plate line PL on a basis of a plate-selection signal PS or /PS. For example, in the cell block 13 as shown in FIG. 1, the plate-selection signal PS is connected to the gate electrode of the plate-selection transistor 15 and the plate-selection signal /PS is connected to the gate electrode of the dummy transistor DT. Accordingly, the cell block 13 is connected to the plate line PL, when the plate-selection signal PS is set to "H" level.

On the contrary, the cell block 13 is not connected to the plate line PL and another cell block (a cell block located at the right side of the cell block 13 in FIG. 1) formed in an adjacent space is connected to the plate line PL, when the plate-selection signal PS is set to "L" level (the plate-selection signal /PS is set to "H" level).

The dummy transistor DT has a threshold voltage adjusted usually so as to be normally on regardless of an applied voltage to the gate electrode. The dummy transistor DT substantially acts as an interconnection composed of a diffusion layer between the drain electrode and the source electrode.

The block-selection transistor 14 connects the cell block 13 to the bit line BL on a basis of a block-selection signal BS or /BS. For example, as shown in FIG. 1, the block-selection signal BS is connected to the gate electrode of the block-selection transistor 14 and the block-selection signal /BS is connected to the gate electrode of the dummy transistor DT in the cell block 13. Therefore, the cell block 13 is connected to the bit line BL, when the block-selection signal BS is set to "H" level.

On the contrary, the cell block 13 is not connect to the bit line /BL and another cell block (a cell block located at right side of the cell block 13 in FIG. 1) formed in an adjacent space is connected to the bit line /BL, when the block-selection signal BS is set to "L" level (the block-selection signal /BS is "H" level).

The cell block 13 is constituted of the 16 memory cells 19. As shown in FIG. 1, the cell block 13 has a cell capacitor block 23 formed on two of the silicon pillars 12. In the capacitor block 23, a ferroelectric film 21 sandwiched by capacitor electrodes 22, each capacitor electrode composed of a conductive material, are stacked in layer. The cell transistors 20 are formed on the sidewalls opposed to each other of the silicon pillars 12 being adjacent each other, each of siliconpillar 12 having the 8 cell transistors and the diffusion region 16 electrically connecting each lower portion at the sidewall of the two silicon pillars 12 to the bottom surface of the cell capacitor block 23.

The cell capacitor block 23 is formed perpendicular to the main surface of the silicon substrate 11 by stacking ferroelectric capacitors 26 in layer. The ferroelectric capacitor 26 composed of the ferroelectric film 21 and the capacitor electrode 22 is configured to a space between the two silicon pillars 12 being adjacent each other.

In the cell capacitor block 23, 8 ferroelectric capacitors 26 are stacked in layer. The capacitor electrode 22 is electrically connected to the drain electrode or the source electrode of the cell transistor 20 formed on the sidewall of the silicon pillar 12 via a cell contact 24. Further, the capacitor electrode 22 of the bottom of the cell capacitor block 23 is directly connected to the diffusion region 16 connecting each lower portion of the sidewalls of the two silicon pillars 12 being adjacent each other.

The 8 cell transistors 20 are formed on each sidewall of the two silicon pillars 12. The 8 cell transistors 20 are connected in series and the cell transistors 20 being adjacent each other share the drain electrode and the source electrode. Moreover, the two cell transistors 20 formed on each lowest portion of the silicon pillars 12 are electrically connected via the diffusion region 16 connecting the cell capacitor block 23, as shown in FIG. 1, so as to connect the 16 cell transistors 20 in series.

Each gate electrode of the cell transistors 20 is formed as each word lines WL0-WL15 and shared by the plurality of cell blocks 13 formed along the word line (perpendicular to the page including FIG. 1).

Figure 2A:
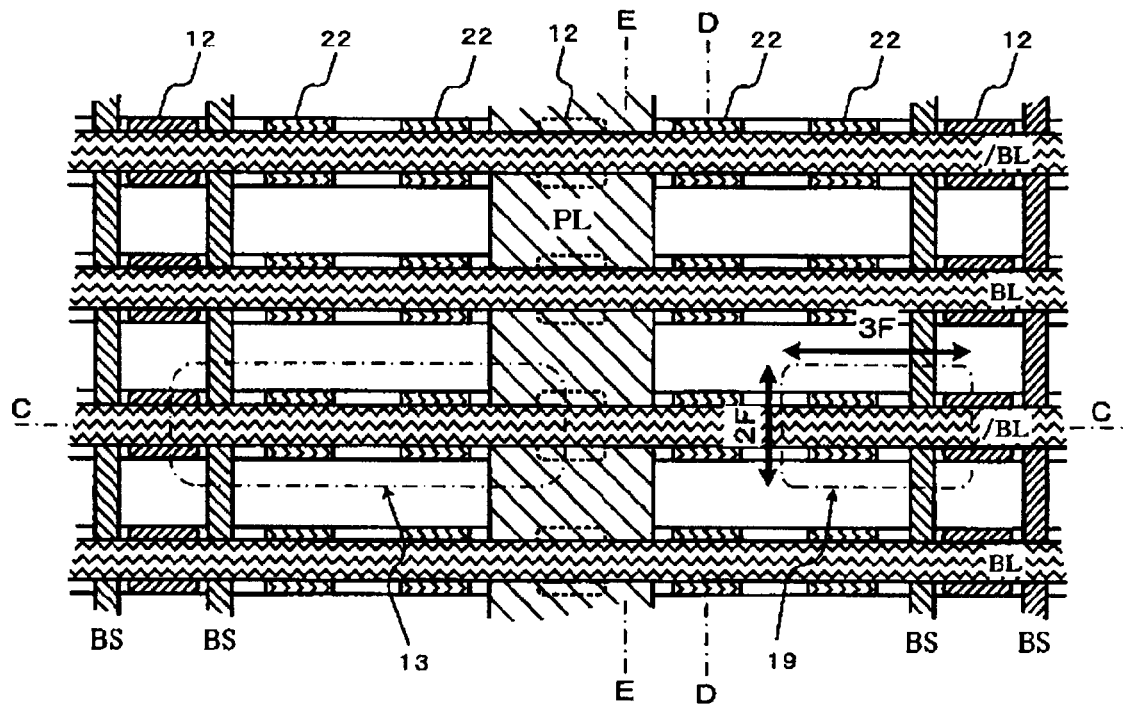
FIGS. 2A and 2B are plane views showing the memory cell portion of the nonvolatile ferroelectric memory according to the first embodiment of the present invention.
Figure 2B:
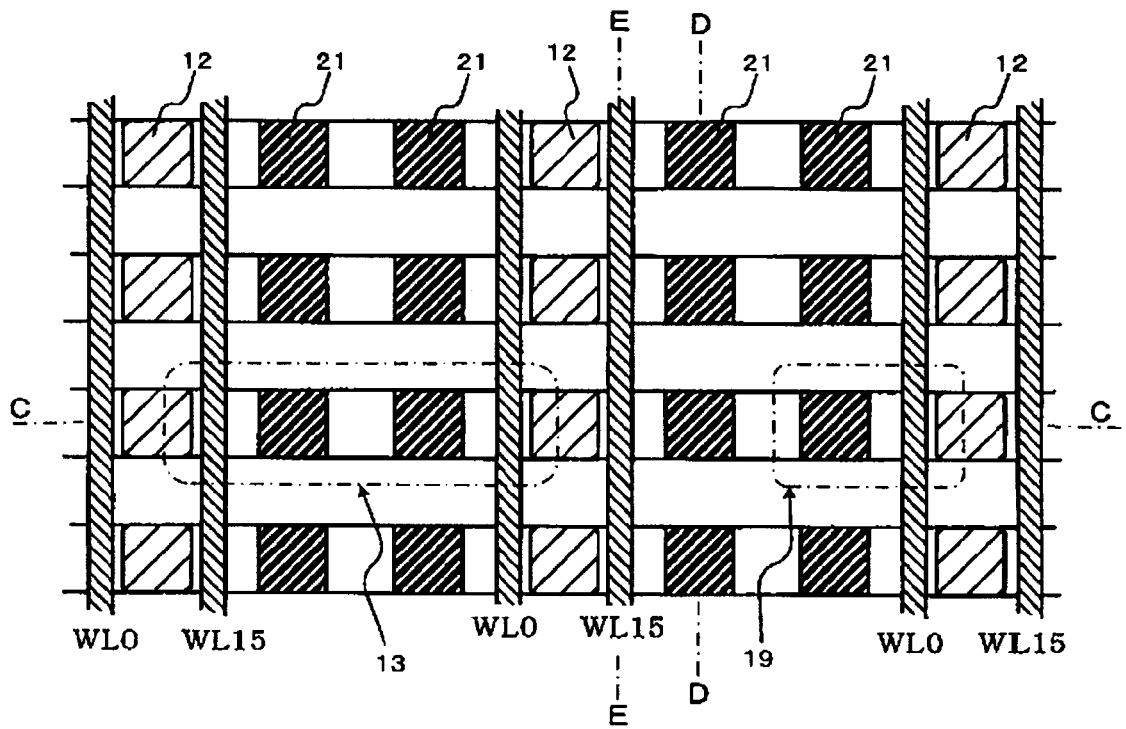
Figure 3:
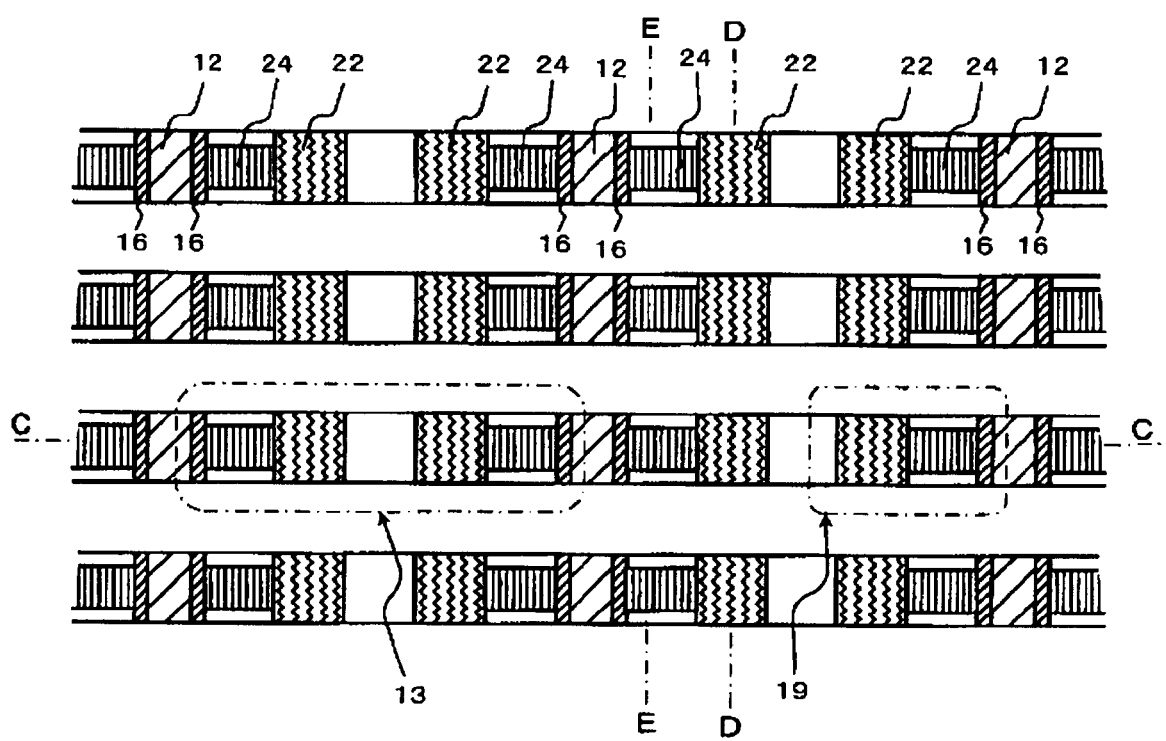
FIG. 3 is a plane view showing the memory cell portion of the nonvolatile ferroelectric memory according to the first embodiment of the present invention.

FIG. 2A-2B and FIG. 3 are plane views showing the memory cell portion of the nonvolatile ferroelectric memory according to the first embodiment of the present invention. Here, FIG. 2 and FIG. 3 mainly show a region including two sets of bit line pairs BL and /BL, and three columns of the silicon pillars 12.

FIG. 2A is a plane view showing as a top view of FIG. 1. Four bit lines (2 sets of the bit line pairs BL and /BL) disposed between 2F pitches each other are corresponding to the 3 silicon pillars 12. The 8 cell block 13 are formed between the two silicon pillars 12. In FIG. 2A, the silicon pillars 12 illustrated using a dot line, because the silicon pillars 12 can not be shown for being shadowed by the plate line PL. Further, the line C-C in FIG. 2A shows a cross-section illustrated in FIG. 1.

As shown in FIG. 2A, an area of the memory cell 19 from top view is $6F^2$ ($2F \times 3F$). The 8 memory cells 19 are formed on one sidewall of the silicon pillar 12. Therefore, a cell size is substantially $6F^2/8=0.75F^2$.

FIG. 2B is a horizontally cross-sectional view of A-A cross section in FIG. 1. The word lines (WL0-WL15) are shared by the plurality of cell blocks 13 repeatedly formed along the word line direction (longitudinal to the page including FIG. 2) as shown in FIG. 2B.

FIG. 3C is another horizontally cross-sectional view showing B-B cross section in FIG. 1. The cell block 13 is isolated along the word line direction (longitudinal direction to the page including FIG. 3) by a dielectric material, as shown in FIG. 3C. The diffusion regions 16 being the drain electrode and the source electrode of the cell transistor 20 are separated on each sidewall of the silicon pillar 12, respectively.

The diffusion region 16 is electrically connected to the capacitor electrode 22 of the cell capacitor block 23 via the cell contact 24.

Figure 4:
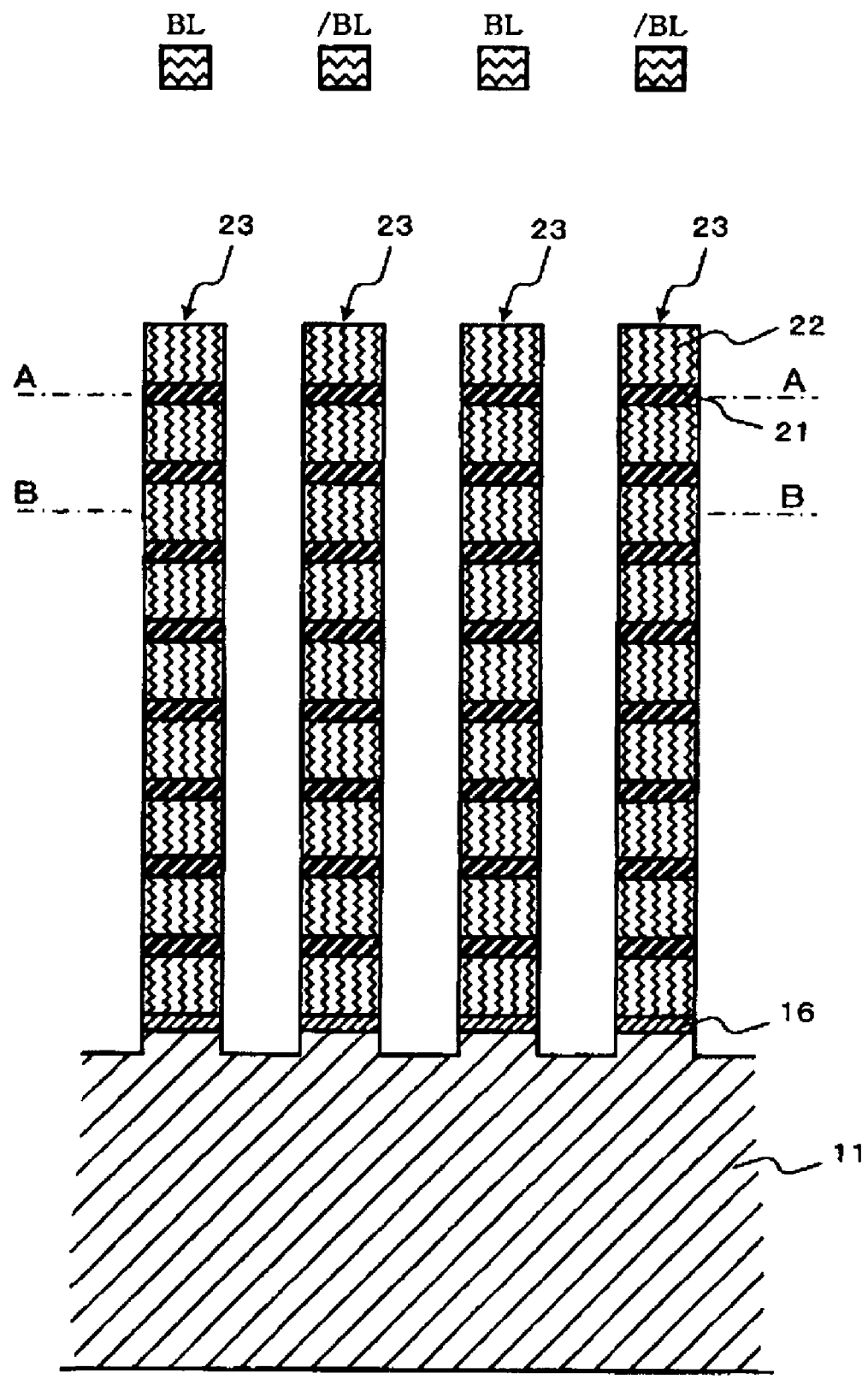
FIG. 4 is an elevational view showing D-D cross-section of the memory cell portion of the nonvolatile ferroelectric memory in FIG. 1 according to the first embodiment of the present invention.

FIG. 4 is an elevational view showing D-D cross section of the memory cell portion of the nonvolatile ferroelectric memory in FIG. 1 according to the first embodiment of the present invention. The elevational view is shown along the word line in FIG. 1. The cell capacitor blocks 23 are repeatedly disposed along the word line (horizontal direction to the page including FIG. 4) and are isolated by the dielectric material as shown in FIG. 4. Further, the main surface of the silicon substrate 11 is grooved to an extent of a depth at least to isolate the diffusion regions 16.

By processing steps mentioned above, the bottom of the cell capacitor block 23 is directly connected to the diffusion region 16. On the other hand, the cell blocks 13 are electrically separated each other.

Figure 5:
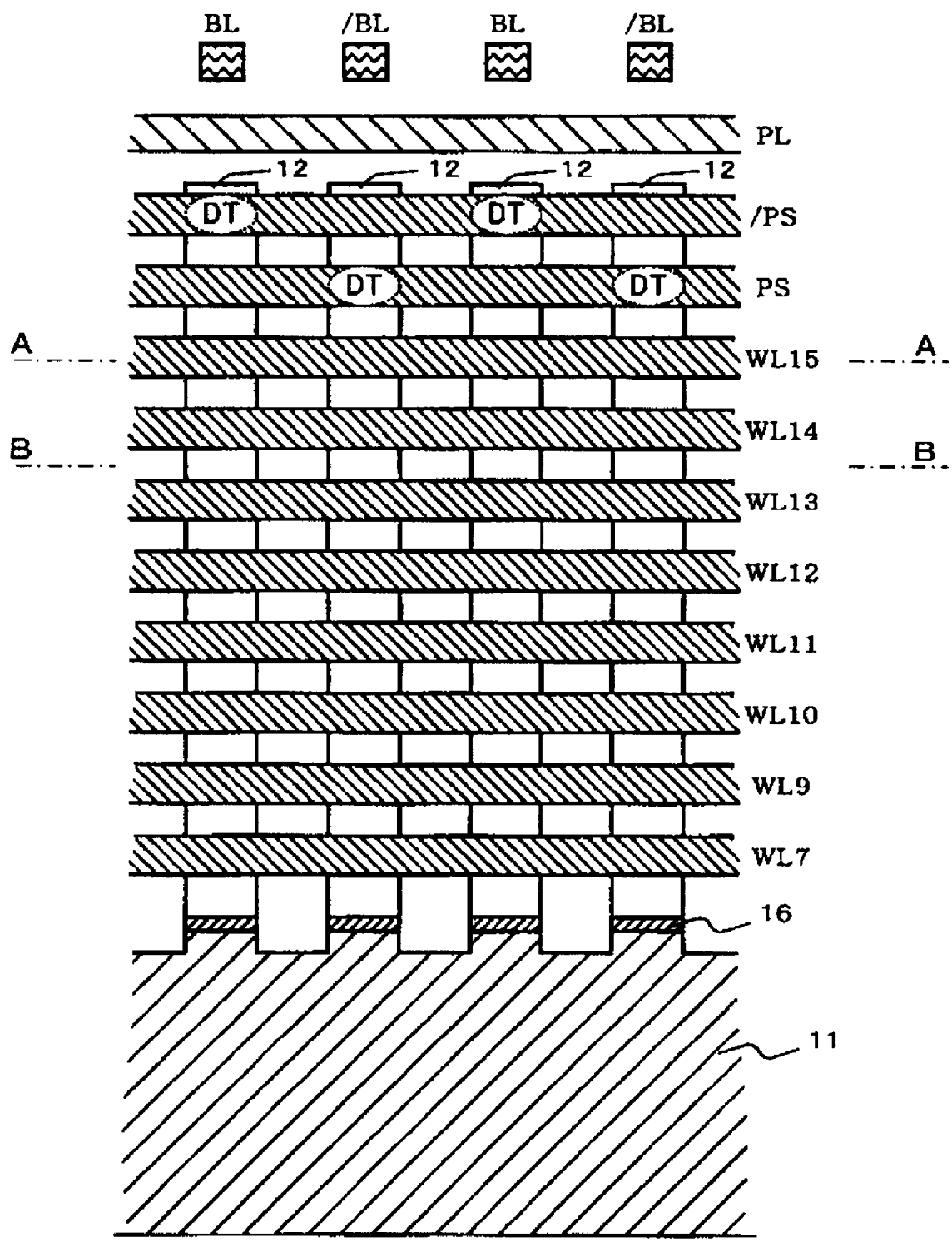
FIG. 5 is an elevational view showing E-E cross-section of the memory cell portion of the nonvolatile ferroelectric memory in FIG. 1 according to the first embodiment of the present invention.

FIG. 5 is a cross-sectional view showing E-E cross section of the memory cell portion of the nonvolatile ferroelectric memory in FIG. 1 according to the first embodiment of the present invention. The cross-sectional view is shown along the word line in FIG. 1. The word lines WL0-WL15 and the plate-selection signal lines PS and /PS are shared by each cell block 13 (not illustrated) repeatedly disposed along the word line (horizontal direction to the page including FIG. 5) as shown in FIG. 5. One of the two transistors constituted of the plate-selection signal lines PS and /PS in each cell block 13 (not illustrated) is formed as the dummy transistor DT.

In FIG. 5, the dummy transistor DT is interleaved between the plate-selection signal lines PS and /PS along the word line. Disposing of the dummy transistor DT, in addition to including the block-selection signal lines BS and /BS, is described by using FIG. 6.

Figure 6:
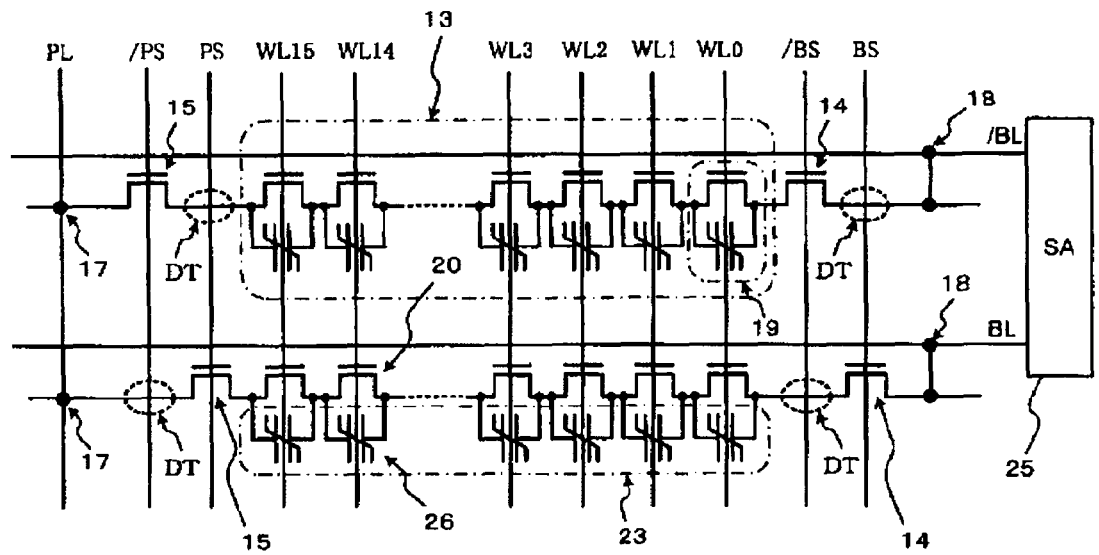
FIG. 6 is a circuit diagram showing the memory cell portion of the nonvolatile ferroelectric memory according to the first embodiment of the present invention.

FIG. 6 is a circuit diagram showing the memory cell portion of the nonvolatile ferroelectric memory according to the first embodiment of the present invention. Here, FIG. 6 mainly shows the two cell blocks 13 and an interconnection portion related to accessing the memory cell.

The memory cell portion in the nonvolatile ferroelectric memory according to the first embodiment of the present invention has a bit line pair BL and /BL, a sense amplifier SA 25 corresponding to the bit line pair BL and /BL, the cell block 13 being connected to each bit line BL or /BL, the block-selection transistor 14 for selecting the cell block 13, the plate line PL being connected to the word lines WL0-WL15 for selecting the memory cell 19 in the cell block 13 and the plate-selection transistor 15 selecting connection to the plate line PL.

One end of each bit line of the bit line pair BL and /BL is connected to the sense amplifier SA 25. The drain terminal of the block-selection transistor 14 is connected to the bit line BL or /BL via the BL contact 18. A source terminal of the block-selection transistor 14 is connected to one end of the cell block 13. The other end of the cell block 13 is connected to the drain terminal of the plate-selection transistor 15. The source terminal of the plate-selection transistor 15 is connected to the plate line PL via the PL contact 17.

Further, the 16 memory cells 19 in the cell block 13 are connected in series. Each gate terminal is connected to the word line WL0-WL15 being corresponded, respectively. The gate terminal of the block-selection transistor 14 connected to the bit line BL is connected to the block-selection signal line BS. The gate terminal of the plate-selection transistor in the cell block 13 being connected to the bit line /BL is connected to the plate-selection signal line PS. The gate terminal of the block-selection transistor 14 connected to the bit line /BL is connected to the block-selection signal line /BS. The gate terminal of the plate-selection transistor connected in the cell block 13 is connected to the plate-selection signal line /PS.

As shown in FIG. 6, arrangements on the dummy transistors DT differs between the cell block 13 connected to the bit line BL and the cell block 13 connected to the bit line /BL. The transistors formed under the block-selection signal line /BS and the plate-selection signal line /PS are the dummy transistors DT in the cell block 13 connected to the bit line BL. The transistors formed under the block-selection signal line BS and the plate-selection signal line PS is the dummy transistors DT n the block 13 connected to the bit line /BL.

This structure is necessary to constitute the bit lines as the folded bit line structure. The structure is corresponding to the dummy transistor DT interleaved beneath the plate-selection signal lines PS and /PS as shown in FIG. 5.

The cell transistor 20 and the ferroelectric capacitor 26 in the memory cell 19 are connected in parallel. A drain terminal (the drain electrode) and a source terminal (the source electrode) of the cell transistor 20 are connected to a capacitor terminal (the capacitor electrode 22) of the ferroelectric capacitor 26, respectively.

As shown in FIG. 6, the ferroelectric capacitor 26 is connected to the cell transistor 20 via each cell contact 24. As the diagram in FIG. 6 is an equivalent circuit, the cell capacitor block 23 is actually a structure stacked the ferroelectric film 21 and the capacitor electrode 22 in layer as shown in FIG. 1. The cell contact 24 is shared by the cell transistors 20 being adjacent each other except the bottom of the cell capacitor block 23.

Next, operation of the memory cell portion is explained in the circuit structure as described above.

First, the word lines WL0-WL15 are set to "H" in standby to turn on all the cell transistors 20. The block-selection signal lines /BS and BS are set to "L" to turn off all the block-selection transistors 14. The plate-selection signal lines /PS and PS are set to "H" to turn on all the plate-selection transistors 15.

As the cell transistor 20 is turned on, the two electrodes (the drain terminal and the source terminal) are shot and the polarization is stably retained in all the ferroelectric capacitor 26 are electrically connected.

The folded bit line is constituted during the circuit operation as shown in FIG. 6. For example, cell data selected are read out to the bit line /BL and the bit line BL act as a reference bit line, when data of ferroelectric capacitor 26 in the cell connected to the word line WL3 and the bit line /BL are read out.

In pre-charging the bit line pair /BL and BL, only the word line WL3 lowered to "L" and the cell transistor 20 connected to the word line WL3 is turned off. In addition, the plate-selection signal line PS controlling the plate-selection transistor 15 being non-select-mode is set to "L", the bit line signal line /BS controlling block-selection transistor 14 being select-mode is set to "H" and the plate line PL is set to "H".

In these steps, the voltage between the plate line PL and the bit line /BL is applied to only selected ferroelectric capacitor 26. Successively, cell data is read out to the bit line /BL.

On the other hand, the cell transistor 20 connected to another ferroelectric capacitor 26 in selected cell block 13 is turned on. As a result, the voltage is not applied to both ends of the cell block 13. Moreover, as the bit line signal line BS is set to "L" and the plate line signal line PS is set to "L", the voltage is not applied to both ends of the non-selected cell block 13. As a result, random access in the memory is realized.

Figures 7A, 7B, 7C:
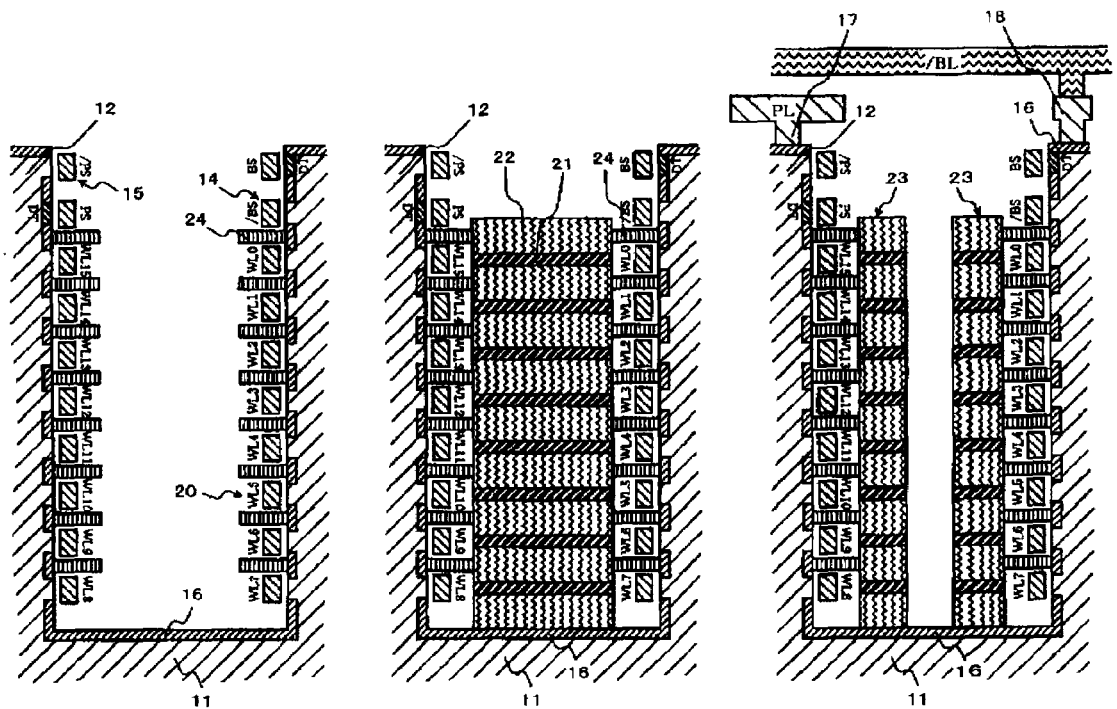
FIGS. 7A-7C are cross-sectional views showing processing steps of the memory cell portion of the nonvolatile ferroelectric memory according to the first embodiment of the present invention.

Next, processing steps of the nonvolatile ferroelectric memory are explained below. FIGS. 7A-7C are cross-sectional views showing the processing steps on the memory cell portion in the nonvolatile ferroelectric memory according to the first embodiment of the present invention. Here, FIGS. 7A-7C mainly show processing steps on forming the cell capacitor block 23 stacked ferroelectric capacitors 26 in layer.

The processing steps of the memory cell portion in the nonvolatile ferroelectric memory according to the first embodiment of the present invention has forming the cell transistor 20 on the sidewall of the silicon pillars 12, stacking ferroelectric capacitors 26 in layer and forming the cell capacitor block 23.

In forming the cell transistor 20, the main surface of the silicon substrate 11 is grooved so as to form the silicon pillars 12. As shown in FIG. 7A, the plurality of vertical transistors, which mean the cell transistors 20, are formed on the sidewall of the silicon pillars 12. The cell transistors 20 are connected in series towards perpendicular to the silicon substrate 11. Furthermore, the diffusion region 16 is formed to electrically connect to the lowest portion of the cell transistor 20 formed on the sidewalls of the two silicon pillars 12 opposed to each other. As a result, the two silicon pillars 12 are connected in series.

Forming the transistor on the sidewalls of the silicon pillars 12 can be comparatively stably realized as reported by H. Takato (H. Takato et al., "Impact of Surrounding gate transistor (SGT) for ultra-high-density LSI's", IEEE Transaction on Electron Devices, vol. 38, No. 3, pp. 573-578, March 1991), for example. A stacking method including forming the silicon transistor, forming an insulator on the silicon transistor, further forming a silicon transistor on the insulator, such as a conventional three-dimension LSI, cannot control defect generation at the interface in the channel and the gate insulator of the transistor, as the channels of the transistors stacked in layer are not formed on a bulk silicon. On the other hand, all of the transistors formed on the bulk silicon can provide with the transistor having stable characteristics. The vertical transistor is formed on a side-wall of a groove forming on a silicon substrate.

Further, in the same processing steps of forming the cell transistor 20, the block-selection transistor 14 and the dummy transistor DT of the block-selection transistor 14, and the plate-selection transistor 15 and the dummy transistor DT of the plate-selection transistor 15 are formed on the upper sidewalls of the silicon pillars 12.

The cell contact 24 is formed so as to connect the drain electrode and the source electrode to the capacitor electrode 22 by using selective epitaxy (SEG) or the like post forming the cell transistor 20.

In stacking the ferroelectric capacitor 26 in layer, a conductive material as the capacitor electrode 22 and the ferroelectric film 21 are interleaved in order in a space between the silicon pillars 12 being adjacent each other. As shown in FIG. 7B, height of the capacitor electrode 22 is the same as that of the cell contact 24.

In forming the cell capacitor block 23, a center portion of the ferroelectric capacitor 26 stacked in layer at the previous process is removed form the top to the bottom by employing RIE (Reactive Ion Etching) or the like. As shown in FIG. 7C, the cell capacitor block 23 is formed on the two silicon pillars 12 being adjacent each other.

Finally, the PL contact 17 and the BL contact 18 are formed to connect to the diffusion region 16 of an upper surface of the silicon pillar 12. Furthermore, the plate line PL, the bit line BL and the bit line /BL are formed over the silicon pillar 12 as shown in FIG. 7C.

FIGS. 8A-8C are cross-sectional views showing another processing steps on the memory cell portion in the nonvolatile ferroelectric memory according to the first embodiment of the present invention. Here, FIGS. 8A-8C being the same as FIGS. 7A-7C mainly show processing steps of forming the cell capacitor block 23.

The processing steps of the memory cell portion in the nonvolatile ferroelectric memory according to the first embodiment of the present invention include forming the cell transistor 20 on the sidewalls of the silicon pillars 12, stacking ferroelectric capacitor 26 in layer and forming the cell capacitor block 23.

In forming the cell transistor 20 as shown in FIG. 8A being the same as in FIG. 7A, the silicon pillars 12 are formed and connected in series. The lowest portion of the cell transistors 20 are electrically connected via the diffusion region 16.

Further, in the same processing steps of forming the cell transistor 20, the block-selection transistor 14 and the dummy transistor DT of the block-selection transistor 14, and the plate-selection transistor 15 and the dummy transistor DT of the plate-selection transistor 15 are formed on the upper portion of the sidewall of the silicon pillar 12.

In stacking ferroelectric capacitor 26 in layer, the conductive material as the capacitor electrode 22 and the ferroelectric film 21 are interleaved in order in a space between the silicon pillars 12. In this case, as shown in FIG. 8B, the cell contact 24 is formed by employing the same processes as the capacitor electrode 22.

In forming the cell capacitor block 23, the two cell capacitor block 23 are formed as same as shown in FIG. 7C.

Finally, the PL contact 17 and the BL contact 18 are formed to connect to the diffusion region 16 of an upper surface of the silicon pillar 12. Furthermore, the plate line PL, the bit line BL and the bit line /BL are formed over the silicon pillar 12 as shown in FIG. 8C.

FIGS. 9A-9E are another processing steps of the memory cell portion in the nonvolatile ferroelectric memory according to the first embodiment of the present invention. FIGS. 9A-9E being the same as shown in FIGS. 7A-7C, mainly show processing steps of forming the cell capacitor block 23.

The processing steps of the memory cell portion in the nonvolatile ferroelectric memory according to the first embodiment of the present invention include forming the cell transistor 20 on the sidewall of the silicon pillar 12, stacking ferroelectric capacitor 26 in layer and forming the cell capacitor block 23.

In forming the cell transistor 20 (FIG. 9A) being the same as FIG. 7A, the silicon pillars 12 are formed and the cell transistor 20 is formed sidewalls of the silicon pillars 12 to connect in series. The lowest portions of the cell transistors 20 are electrically connected via the diffusion region 16. Further, in the same processing steps of forming the cell transistor 20, the block-selection transistor 14 and the dummy transistor DT of the block-selection transistor 14, and the plate-selection transistor 15 and the dummy transistor DT of the plate-selection transistor 15 are formed on the upper sidewalls of the silicon pillars 12.

In stacking ferroelectric capacitor 26 in layer (FIG. 9B-9E), the conductive material as the capacitor electrode 22 and the ferroelectric film 21, the conductive material as the capacitor electrode 22 and the conductive material as the cell contact 24 are interleaved in order in a space between the silicon pillars 12.

First, the conductive material as the capacitor electrode 22, the ferroelectric film 21, and the conductive material as the capacitor electrode 22 are stacked in order on the diffusion region 16 formed in the previous process in a lower portion of a space between the silicon pillars 12.

Figure 9:
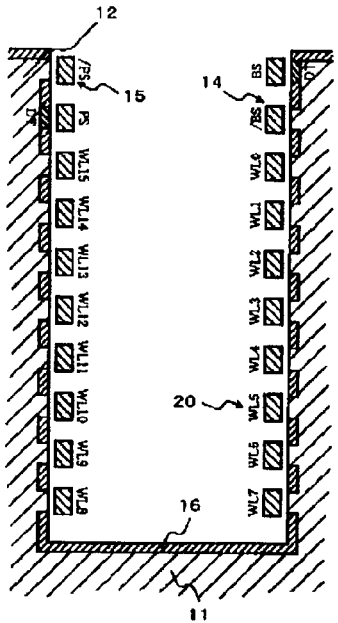
FIGS. 9A-9E are cross-sectional views showing another processing steps of the memory cell portion of the nonvolatile ferroelectric memory according to the first embodiment of the present invention.
Figure 9:
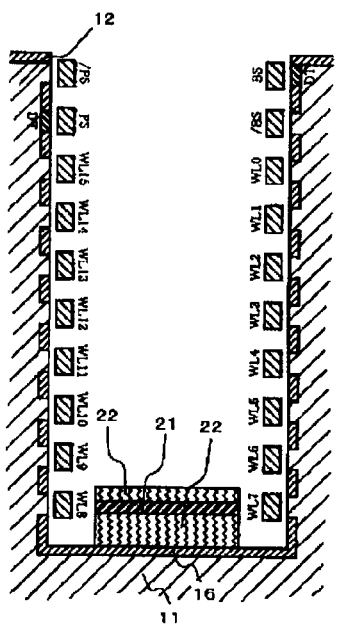
Figure 9:
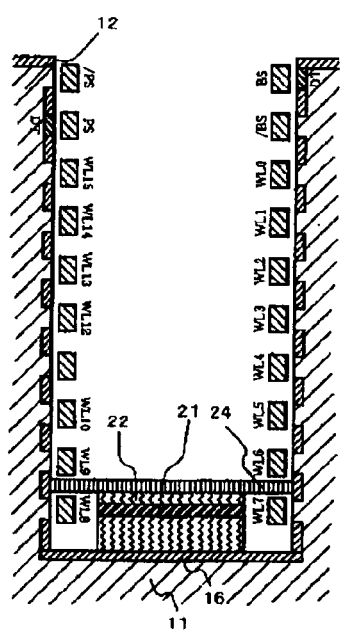
Figure 9:
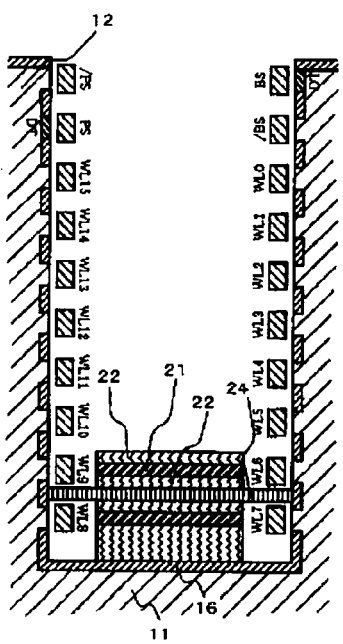
Figure 9:
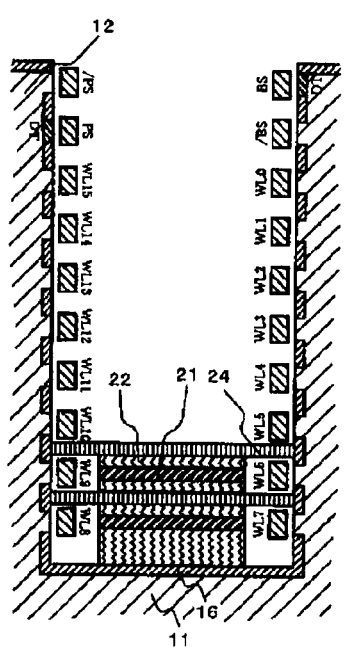

In this case, as shown in FIG. 9B, the upper surface of the layers stacked in layer is formed as same height as a lower surface of the cell contact 24 formed on the lowest portion of the cell block 13.

Next, as shown in FIG. 9C, the conductive material as the cell contact 24 is stacked in layer to connect to the diffusion region 16 of the cell transistor 20.

As shown in FIG. 9D, the conductive material as the capacitor electrode 22, the ferroelectric film 21, and the conductive material as the capacitor electrode 22 are stack in layer. The upper surface of the layers stacked in layer is formed so as to be the same height as the lower surface of the cell contact 24 formed as the second order from the lowest portion of the cell block 13.

As shown in FIG. 9E, the conductive material as the cell contact 24 is stacked in order for connecting the diffusion region 16 of the cell transistor 20. Furthermore, these steps mentioned above are repeated to the top of the cell contact 24, which lead to complete stacking ferroelectric capacitor 26 in layer.

The two cell capacitor block 23 are formed in forming the cell capacitor block 23 (not illustrated) as same as shown in FIG. 7C.

Finally, as same as shown in FIG. 7C, the PL contact 17 and the BL contact 18 connected to the diffusion region 16 on the upper surface being formed of the silicon pillar 12. Further, the plate lines PL, the bit lines BL and /BL are formed over the silicon pillar 12.

According to the first embodiment, as ferroelectric capacitor 26 are stacked perpendicular to the main surface of the silicon substrate 11 in layer so as to form the cell block 13 having a three-dimension structure, the memory cell can be highly integrated.

Further according to the first embodiment, the cell block 13 is constituted by vertically connecting the plurality of memory cells, each memory cell made of one ferroelectric capacitor 26 and one cell transistor 20. Accordingly, the memory cell can be highly integrated without degrading disturb characteristic.

Further according to the first embodiment, as the cell transistor 20 formed on the sidewall of the silicon pillar with a bulk silicon, the device can be comparatively easily fabricated. Moreover, the vertical transistor characteristic can be retained high performance and the memory cell portion can be highly integrated.

Further according to the first embodiment, the dummy transistors DT are suitably formed beneath the block-selection signal line BS and /BS and the plate-selection signal line PS and /PS. As two bit lines being adjacent each other constitute the folded bit line, random accesses with high speed and stable operation can be realized.

Further according to the first embodiment, as the block-selection transistor and the plate-selection transistor are formed on the upper sidewall of the silicon pillar as same as the cell transistor, the ferroelectric memory chip having a smaller area can be realized.

Further according to the first embodiment, however the cell block has 16 memory cells, the present invention is not limited to a cell block structure. A cell block can be principally constituted of free number of the memory cells.

Second Embodiment

Figure 10:
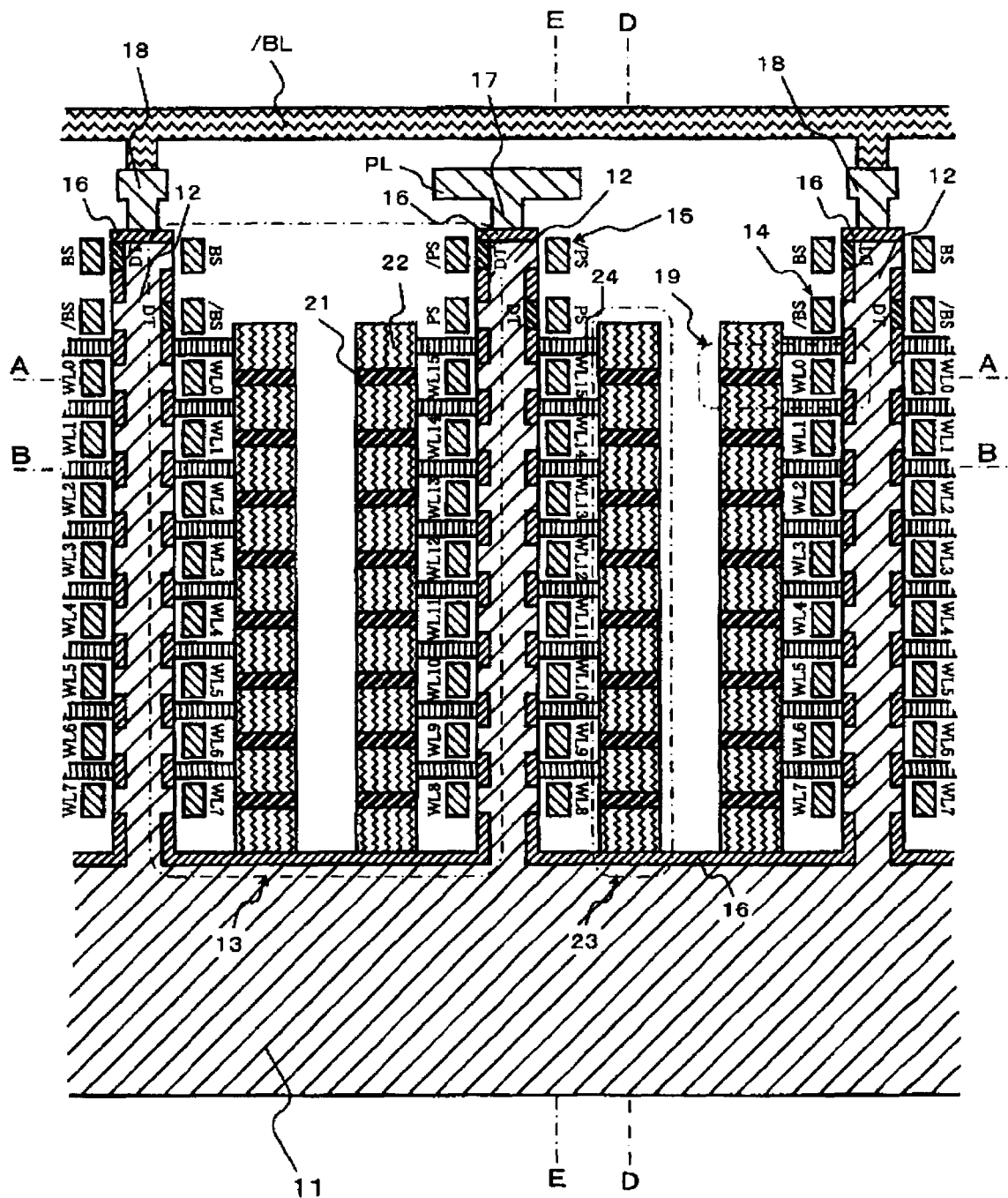
FIG. 10 is a cross-sectional view showing a memory cell portion of a nonvolatile ferroelectric memory according to a second embodiment of the present invention.

First, FIG. 10 is a cross-sectional view showing a memory cell portion of a nonvolatile ferroelectric memory according to a second embodiment of the present invention. Here, FIG. 10 mainly shows a memory cell block constituted of a plurality of ferroelectric memory cells and an interconnection portion related to accessing the memory. In FIG. 10, a portion of the same composition as the first embodiment is attached the same number.

The memory cell portion of the nonvolatile ferroelectric memory according to the second embodiment of the present invention includes a plurality of silicon pillars 12. The memory cell portion has the plate line PL disposed over the silicon pillars 12 along the word line (perpendicular to the page including FIG. 10), the bit line BL or /BL disposed over the plate line PL along orthogonal direction to the plate line PL (horizontal direction to the page including FIG. 10), the cell block 13 formed in a space between two of the silicon pillars 12 being adjacent each other, the block-selection transistor 14 and a dummy transistor DT configured to an upper portion of the sidewall of one of the two silicon pillars 12, and the plate-selection transistor 15 and another dummy transistor DT configured to an upper potion of the sidewall of the other of the silicon pillars 12.

As the main component portions mentioned above, except a structure and an arrangement order of the word lines WL0-WL15 in the cell block 13, are the same as those of the first embodiment, a detail explanation on the memory cell portion is omitted.

The arrangement order of the word lines WL0~WL15 in the cell block 13 is different from that of the first embodiment. The word line having the same number is disposed on both sidewalls of the silicon pillar 12, as shown in FIG. 10. The word lines WL0-WL7 are disposed on the one sidewall of the silicon pillar 12 opposite to the other sidewall having the word lines WL0-WL7 in the same order, the word lines WL8-WL15 are disposed on the one sidewall of the silicon pillar 12 opposite to the other sidewall having the word lines WL8-WL15 in the same order.

Figure 11:
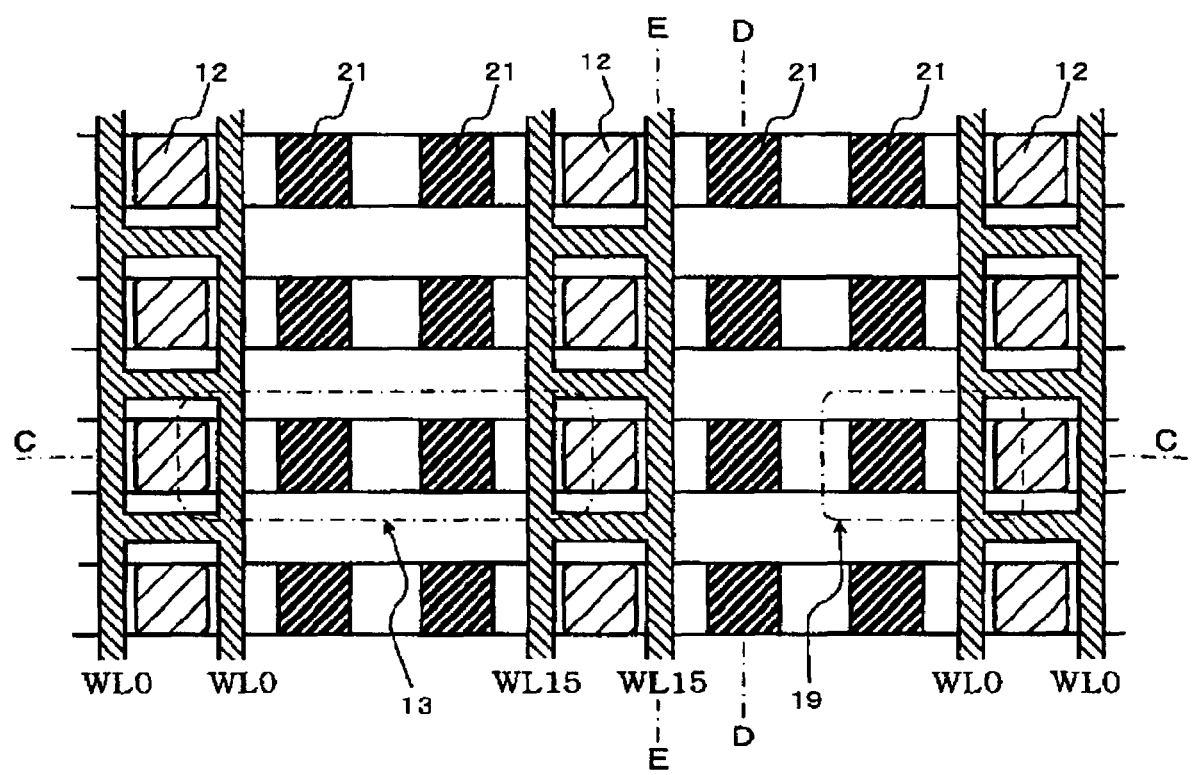
FIG. 11 is a horizontally cross-sectional view showing A-A cross-section of the memory cell portion in the nonvolatile ferroelectric memory in FIG. 1 according to the second embodiment of the present invention.
Figure 1:
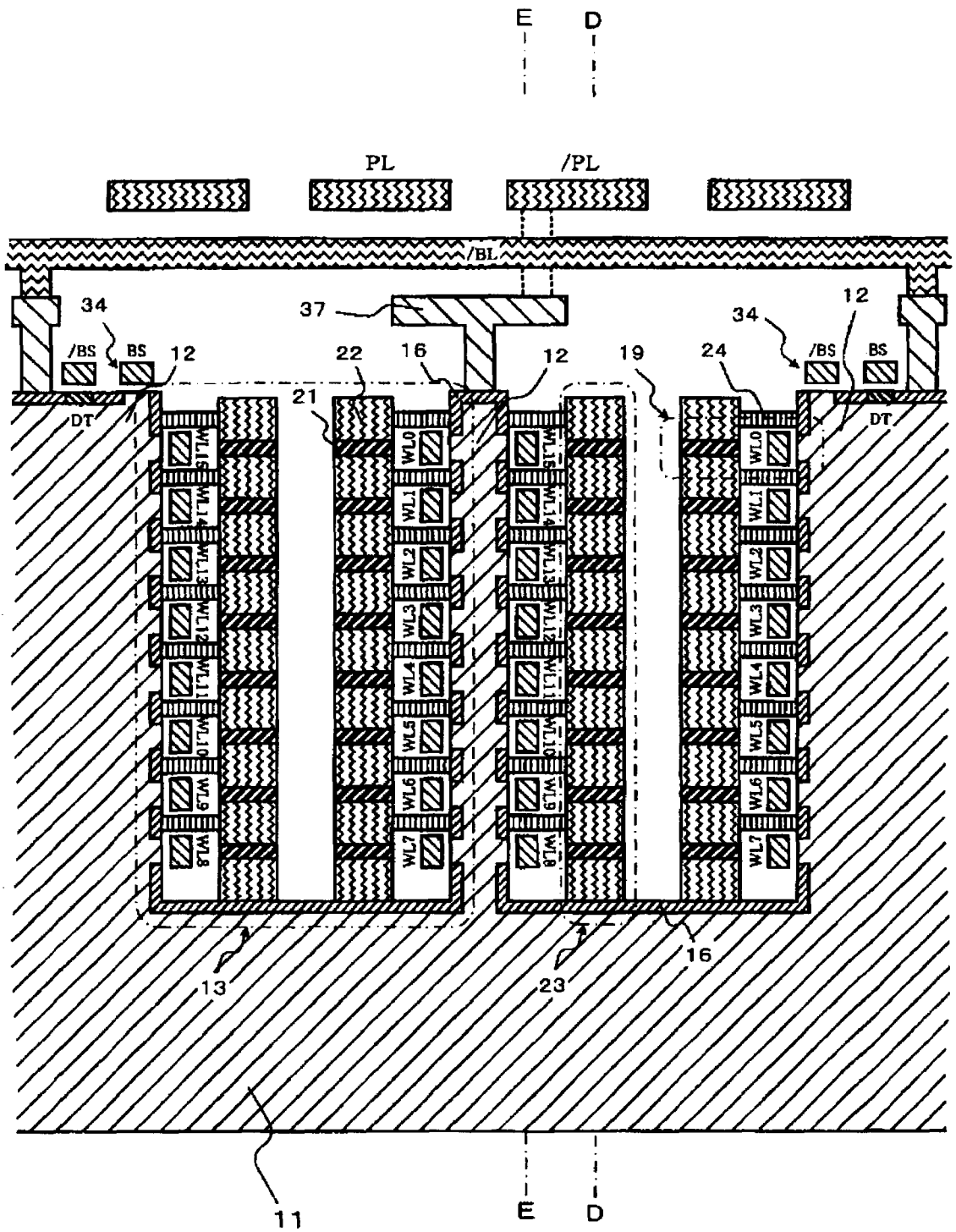

FIG. 11 is a plane view showing the memory cell portion of the nonvolatile ferroelectric memory according to the second embodiment of the present invention. Here, FIG. 11 mainly shows a region including two sets of the bit line pairs BL and /BL, and three columns of the silicon pillars 12. A dielectric material is illustrated as same as the first embodiment.

As the word lines WL0-WL15 at both sides of the silicon pillar 12 are the same signal line in the second embodiment, the word lines WL0-WL15 surrounding the silicon pillars 12 are formed as shown in FIG. 11. The gate electrodes BS and /BS of the block-selection transistor 14 and the gate electrodes PS and /PS of the plate-selection transistor 15 formed over the cell block 13 are also formed to enclose the silicon pillar 12.

As the operation on the memory cell portion and the fabricating method of the second embodiment are the same as those of the first embodiment, an explanation is omitted.

In addition to the effects described in the first embodiment, the word lines WL are formed to enclose the silicon pillar 1 according to the second embodiment 2. As the word lines sandwiching the silicon pillar 12 are not necessary to transmit different signals, the structure is realized by simple processing steps.

Further according to the second embodiment, however the cell block has 16 memory cells, the present invention is not limited to a cell block structure. A cell block can be principally constituted of free number of the memory cells.

Third Embodiment

First, FIG. 12 is a cross-sectional view showing a memory cell portion in a nonvolatile ferroelectric memory according to a third embodiment of the present invention. Here, FIG. 10 mainly shows a memory cell block constituted of a plurality of ferroelectric memory cells and an interconnection portion related to accessing the memories. In FIG. 10, a portion of the same composition as the first embodiment is attached the same number.

The memory cell portion of the nonvolatile ferroelectric memory according to the third embodiment of the present invention includes the plurality of silicon pillars 12. The memory cell portion has the bit line /BL over the silicon pillars 12 along perpendicular to the word line (horizontal direction to the page including FIG. 13), the plate lines PL and /PL disposed over the bit line BL along the word line (perpendicular direction to the page including FIG. 13), the cell block 13 formed in a space between two of the silicon pillars 12 being adjacent each other, the block-selection transistor 34 and the dummy transistor DT configured to an upper portion of the sidewall of one of the two silicon pillars 12, and a PL contact 37 connected to the diffusion region 16 configured to an upper portion of the sidewall of the other of the silicon pillars 12.

As the main component portions mentioned above, except a block-selection transistor 34 and the plate lines PL and /PL, are the same as the first embodiment, a detail explanation is omitted.

The differences between the third embodiment and the first embodiment are that the block-selection transistor 34 is formed on the upper surface of the silicon pillars 12 and the two plate lines PL and /PL being complement are disposed over the /bit line BL instead of a plate-selection transistor.

As shown in FIG. 12, the block-selection transistor 34 and the dummy transistor DT are formed on the upper surface of the silicon pillars 12. The silicon pillar 12 connected to PL contact, having a width of 1F, and another silicon pillar 12 being formed the block-selection transistor 34, having a width of 7F, are interleaved along the bit line.

The source electrode of one end of the cell transistor 20 in the cell block 13 is connected to the BL contact 18 via the block-selection transistor 34 and the dummy transistor DT directly connected to the upper surface of the silicon pillars 12.

The drain electrode of the other end of the cell transistor 20 in the cell block 13 is connected to the plate line PL or /PL (/PL in the case of FIG. 12) via the diffusion region 16 and a PL contact 37 connected to the upper surface of another silicon pillar 12.

As mentioned above, an interval of the silicon pillars 12 is 9F per one cell block 13 and the 16 memory cell 19 are formed in one cell block 13. Therefore, a size of the memory cell 19 is substantially $2F \times 9F/16 = 1.125F^2$.

Figure 13:
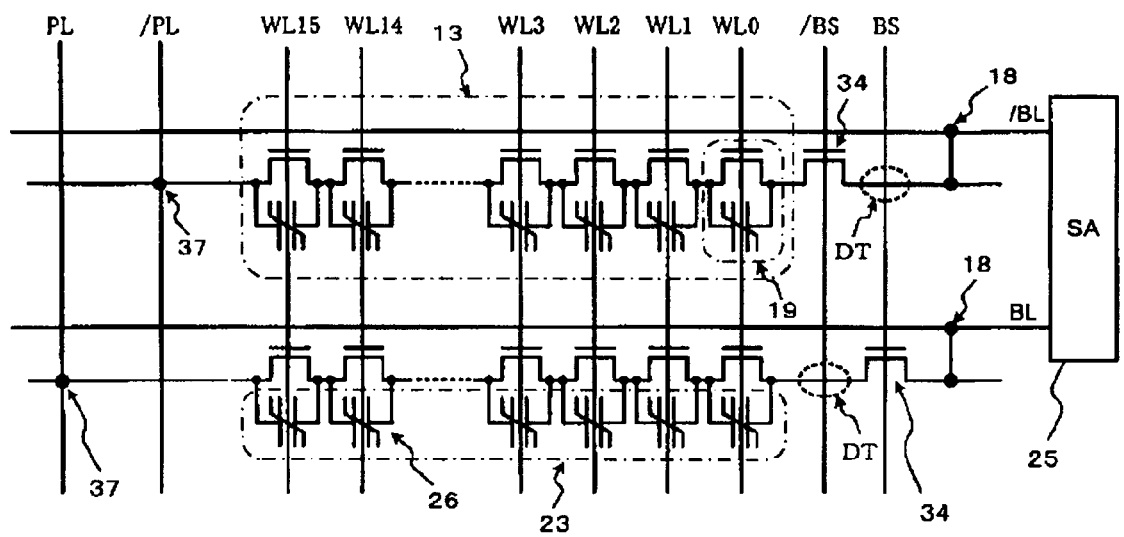
FIG. 13 is a circuit diagram showing the memory cell portion of the nonvolatile ferroelectric memory according to the third embodiment of the present invention.

FIG. 13 is a circuit diagram showing the memory cell portion of the nonvolatile ferroelectric memory according to the third embodiment of the present invention. Here, FIG. 13 mainly shows the two cell blocks 13 and an interconnection portion related to accessing the memory cell.

The memory cell portion in the nonvolatile ferroelectric memory according to the third embodiment of the present invention has the bit line pair BL and /BL, the sense amplifier SA 25 corresponding to the bit line pair BL and /BL, the cell block 13 being connected to each bit line BL or /BL, the block-selection transistor 34 for selecting the cell block 13, the plate line PL being connected to the word lines WL0-WL15 for selecting the memory cell 19 in the cell block 13 and the plate lines PL and /PL connected to the cell block 13.

As an equivalent circuit according to the third embodiment is the same as that of the first embodiment, except a connection portion connecting the cell block 13 to the plate line PL or /PL as shown in FIG. 13, a detail explanation on the equivalent circuit is omitted.

The differences between the third embodiment and the first embodiment are that the cell block 13 connected to the bit line BL connects to the plate line PL via the PL contact 37 and the cell block 13 connected to /BL connects to /PL via another PL contact 37 instead of a plate-selection transistor.

As mentioned above, the plate-selection transistor 15 is omitted by using the complementally plate line PL and /PL corresponding to the bit line pair BL and /BL.

Next, operation of the memory cell portion is explained in the circuit structure as described above.

First, the word lines WL0-WL15 "H" are set to turn on all the cell transistors 20 in standby. The bit line signal lines /BS and BS are set to "L" to turn off all the block-selection transistors 34.

As the cell transistor 20 is turned on, the two electrodes (the drain terminal and the source terminal) in all ferroelectric capacitor 26 are electrically shot and the polarization is stably retained.

Next, the circuit as shown in FIG. 13 acts as the folded bit line constitution in the circuit operation. For example, cell data selected are read out to the bit line /BL and the bit line BL act as a reference bit line, when data of ferroelectric capacitor 26 in the cell connected to the word line WL3 and the bit line /BL are read out.

In pre-charging the bit line pair /BL and BL, only the word line WL3 lowered to "L" and the cell transistor 20 connected to the word line WL3 is turned off. In addition, the bit line signal BS controlling the block-selection transistor 34 being select-mode is set to "H", the plate line PL being non-select-mode is set to "L", only the plate line PL being select-mode is set to "H".

In these steps, the voltage between the plate line /PL and the bit line /BL is applied to only ferroelectric capacitor 26 selected. Successively, cell data is read out to the bit line /BL.

On the other hand, the cell transistor 20 connected to another ferroelectric capacitor 26 in selected cell block 13 is turned on. The voltage is not applied to both ends of the cell block 13. Moreover, as the bit line signal BS is set to "L" and the plate line signal PS is set to "L", the voltage is not applied to both ends of the non-selected cell block 13. As a result, random access in the memory is realized.

As the fabricating method of the third embodiment is the same as that of the first embodiment, an explanation is omitted.

According to the third embodiment, as the ferroelectric capacitor 26 are stacked perpendicular to the main surface of the silicon substrate 11 in layer so as to form the cell block 13 having a three-dimension structure, the memory cell can be highly integrated.

Further according to the third embodiment, the cell block 13 is constituted by vertically connecting the plurality of memory cells, each memory cell made of one ferroelectric capacitor 26 and one cell transistor 20. Accordingly, the memory cell can be highly integrated without degrading disturb characteristic.

Further according to the third embodiment, as the cell transistor 20 formed on the sidewall of the silicon pillar with a bulk silicon, the device can be comparatively easily fabricated. Moreover, the vertical transistor characteristic can be retained high performance and the memory cell portion can be highly integrated.

Further according to the third embodiment, the dummy transistors DT are suitably formed beneath the block-selection signal line BS and /BS and the plate-selection signal line PS and /PS. As two bit lines being adjacent each other constitute the folded bit line, random accesses with high speed and stable operation can be realized.

Further according to the third embodiment, as the block-selection transistor is formed on the upper surface of the silicon pillar, the ferroelectric memory chip having a smaller area can be realized by simple processing steps.

Further according to the third embodiment, however the cell block has 16 memory cells, the present invention is not limited to the cell block structure. A cell block can be principally constituted of free number of the memory cells.

Fourth Embodiment

Figure 14:
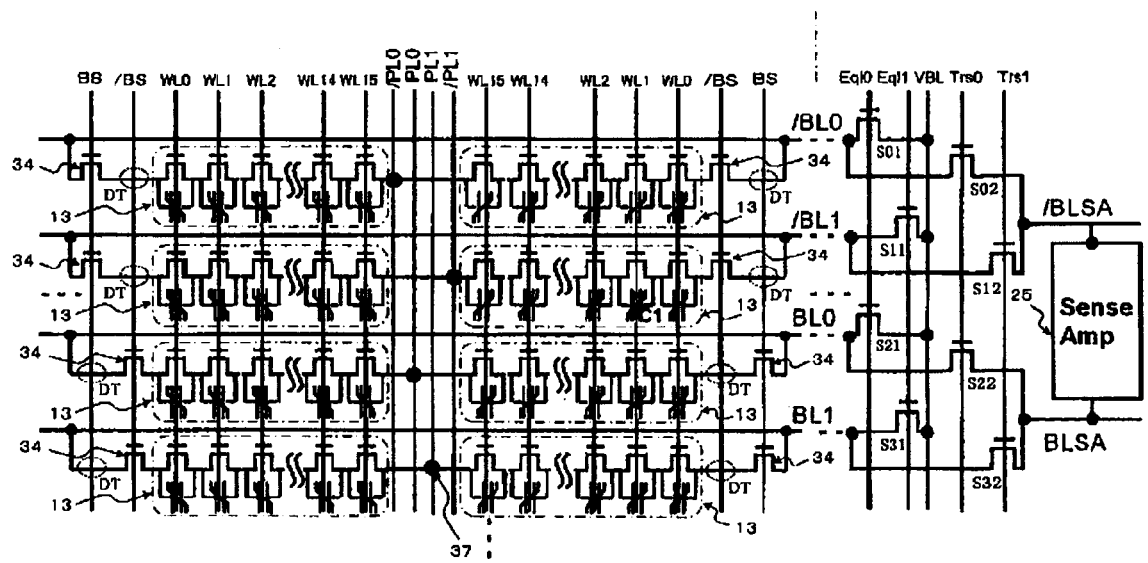
FIG. 14 is a circuit diagram showing a memory cell portion of a nonvolatile ferroelectric memory according to a fourth embodiment of the present invention.

FIG. 14 is a circuit diagram showing a memory cell portion of a nonvolatile ferroelectric memory according to a fourth embodiment of the present invention. Here, FIG. 14 mainly shows two sets of a bit line pair BL0 and /BL0, and a bit line pair BL1 and /BL1 and portions related to accessing the memory cell. In FIG. 14, a portion of the same composition as the third embodiment is attached the same number.

The memory cell portion in the nonvolatile ferroelectric memory according to the fourth embodiment of the present invention has two sets of the bit line pairs BL and /BL, the 8 cell blocks 13 wherein two cell blocks, respectively, are a pair being connected to each of the four bit lines BL or /BL, the block-selection transistor 34 for selecting the cell block 13, the word lines WL0-WL15 for selecting the memory cell 19, two sets of the plate line pairs PL and /PL (PL0 and /PL0, and PL1 and /PL1), four equalized transistors S01, S11, S21 and S31 for pre-charging each bit line, four switched transistors S02, S12, S22 and S32 for selecting a set of the bit line pair BL and /BL in the two pairs so as to connect to a main bit line pair BLSA and /BLSA, and the sense amplifier 25 corresponding to the bit line pair BLSA and /BLSA.

The two bit lines of bit line pair BLSA and /BLSA are connected to the sense amplifier SA 25, respectively. One end of the bit line BLSA is connected to the drain terminal of the switched transistor S22 and the drain terminal of the switched transistor S32. The bit line /BLSA is connected to the drain terminal of the switched transistor S02 and the drain terminal of the switched transistor S12.

The gate terminal of the switched transistor S02 and the gate terminal of the switched transistor S22 are connected to a first signal line Trs0 for selecting the bit line pair BL and /BL in the two bit line pairs. The gate terminal of the switched transistor S12 and the gate terminal of the switched transistor S32 are connected to a second signal line Trs1 for selecting the bit line pair BL and /BL in the two bit line pairs.

The source terminal of the switched transistor S02 is connected to one end of the bit line /BL0 and the drain terminal of the switched transistor S01. The source terminal of the switched transistor S12 is connected to one end of the bit line /BL1 and the drain terminal of the equalized transistor S11. The source terminal of the switched transistor S22 is connected to one end of the bit line BL0 and the drain terminal of the equalized transistor S21. The source terminal of the switched transistor S32 is connected to one end of the bit line BL1 and the drain terminal of the equalized transistor S31.

The gate terminal of the equalized transistor S01 and the gate terminal of the equalized transistor S21 are connected to a first equalized signal line Eq10. The gate terminal of the equalized transistor S11 and the gate terminal of the equalized transistor S31 are connected to a second equalized signal line Eq11. The source terminals of the equalized transistors S01, S11, S21 and S31 are connected to a power source line VBL.

Each of the two cell blocks is connected to each of the bit line pair BL0, /BL0, and the bit line pair BL1 and /BL1, respectively, via the block-selection transistor 34 and the dummy transistor DT of the block-selection transistor 34. Each of the cell blocks 13 is connected to the plate line corresponding to the bit line.

Each end of the two cell blocks 13 is connected to the plate line PL0 where the other ends of the two cell blocks 13 is connected to the bit line BL0. Each end of the two cell blocks 13 is connected to the plate line PL1 where the other ends of the two cell blocks 13 is connected to the bit line BL1. Each end of the two cell blocks 13 is connected to the plate line /PL0 where the other ends of the two cell blocks 13 is connected to the bit line /BL0. Each end of the two cell blocks 13 is connected to the plate line /PL1 where the other ends of the two cell blocks 13 is connected to the bit line /BL1.

As the structure and the connection of the signals of the cell block 13 are the same as the third embodiment, a detail explanation on the memory cell portion is omitted.

One of the two cell blocks 13 connected to the bit line BL0 is selected by the complementary block-selection signal lines BS and /BS. The first cell block 13 is connected to the bit line BL0 via the block-selection transistor 34 input the block-selection signal line BS to the gate. The second cell block 13 is connected to the bit line BL0 via the block-selection transistor 34 input the block-selection signal line /BS to the gate.

As the same process mentioned above, the first cell block 13 connected to the bit line BL1 is connected to the bit line BL1 via the block-selection transistor 34 input the block-selection signal line BS to the gate terminal. The second cell block 13 connected to the bit line BL1 is connected to the bit line BL1 via the block-selection transistor 34 input the block-selection signal line /BS to the gate terminal.

Furthermore, the first cell block 13 connected to the bit line /BL0 is connected to the bit line BL0 via the block-selection transistor 34 input the block-selection signal line /BS to the gate. The second cell block 13 connected to the bit line /BL0 is connected to the bit line BL1 via the block-selection transistor 34 input the block-selection signal line BS to the gate.

Furthermore, the first cell block 13 connected to the bit line /BL1 is connected to the bit line BL1 via the block-selection transistor 34 input the block-selection signal line /BS to the gate terminal. The second cell block 13 connected to the bit line /BL1 is connected to the bit line /BL1 via the block-selection transistor 34 input the block-selection signal line BS to the gate terminal.

The four first cell blocks 13 mentioned above share common word lines WL0-WL15. On the other hand, the four second cell blocks 13 share another common word lines WL0-WL15.

Next, operation of the memory cell portion is explained in the circuit structure as described above. First, the word lines WL0-WL15 are set to "H" of and the bit line signal lines /BS and BS is set to "L" of in standby. The word lines WL0-WL15 and the bit line signal lines /BS and BS lead polarization of all the ferroelectric capacitor 26 to be stably retained. Furthermore, the equalized signal lines Eq10 and Eq11 are set to "H" and the bit line pairs BL0, /BL0, and BL1, and /BL1 precharged to "L" in standby.

Next, as shown in the circuit of FIG. 14, the bit line pair selected act as the folded bit line constitution in operation. For example, cell data selected is read out to the bit line /BL0 and the bit line BL0 act as a reference bit line, when data of ferroelectric capacitor 26 in the cell connected to the word line WL2 and the bit line /BL0 is read out. Moreover, the bit lines BL1 and /BL1 are set to the non-selected-mode by the equalized signal line Eq11 and the second signal line Trs1.

The equalized signal line Eq0 is set to "L" and the first signal line Trs0 is set to "H", so that the bit line pair BL0 and /BL0 are connected to the sense amplifier 25. Only word line WL2 is lowered to "L", where in pre-charging state of the bit line pair BL0 and /BL0. As a result, the cell transistor 20 connected to the word line WL2 is turned off.

In addition, the bit line signal line /BS controlling the block-selection transistor 34 being select-mode is set to "H", the plate lines PL0, PL1 and /PL1 being non-select-mode is retained at "L", only plate line PL0 being select-mode is raised to "H".

In these steps, only selected ferroelectric capacitor 26 is applied with the voltage between the plate lines /PL0 and the bit line /BL0. Successively, cell data is read out to the bit line /BL0.

On the other hand, as the cell transistor 20 connected to another ferroelectric capacitor 26 in selected cell block 13 is turned on, the voltage is not applied to both ends of the cell block 13. Moreover, as the bit line signal line BS is set to "L" and the plate line signal line PS0 is set to "L", the voltage is not applied to both ends of non-selected the cell block 13. As a result, random access in the memory is realized.

Furthermore, as the equalized signal line Eq11 is set to "H" and the second signal line Trs1 is set to "L", the bit line pair BL1 and /BL1 being non-selected-mode are connected to the power source line VBL so as to retain "L" as same as in standby.

Figure 15:
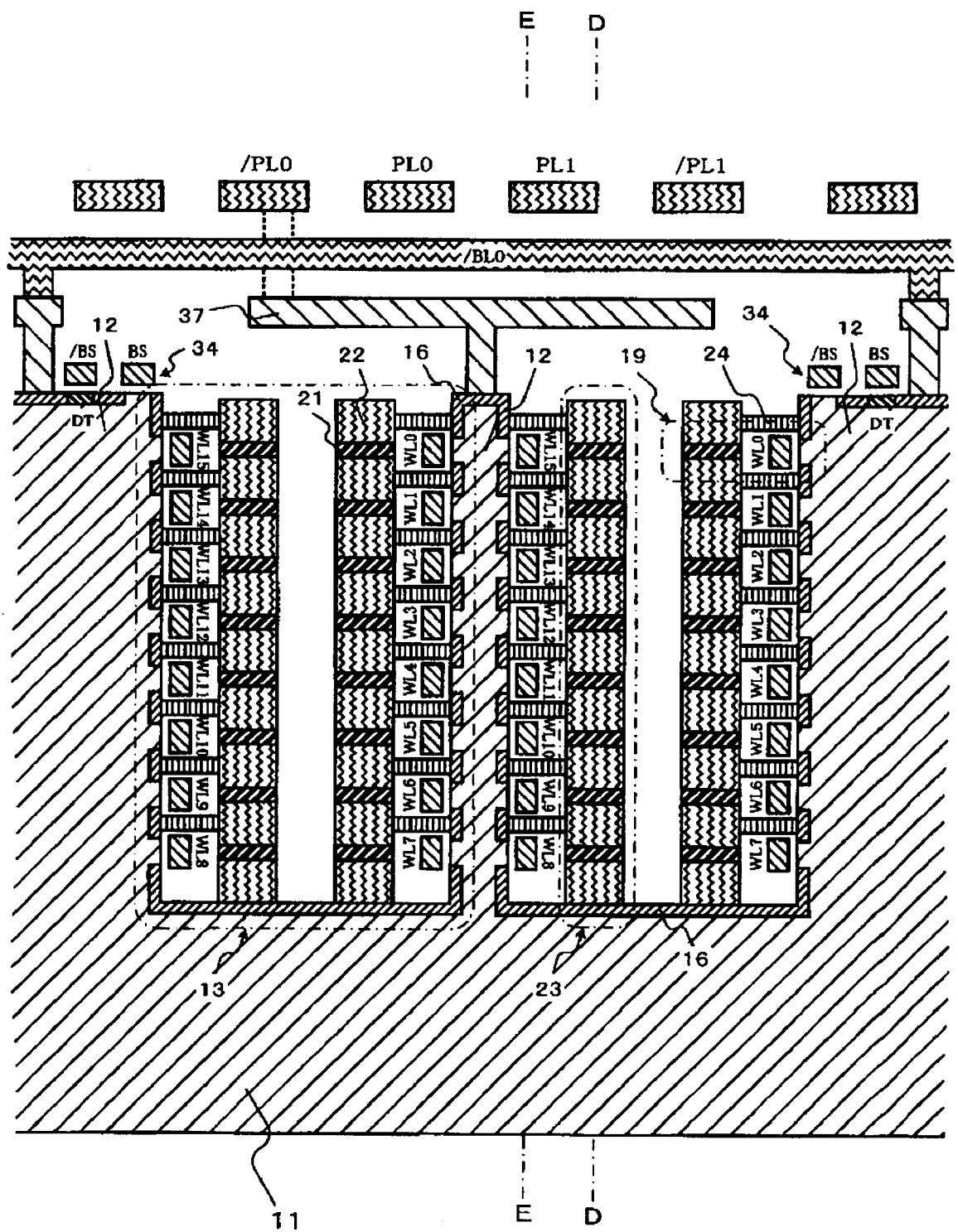
FIG. 15 is a cross-sectional view showing the memory cell portion of the nonvolatile ferroelectric memory according to the fourth embodiment of the present invention.
Figure 1:
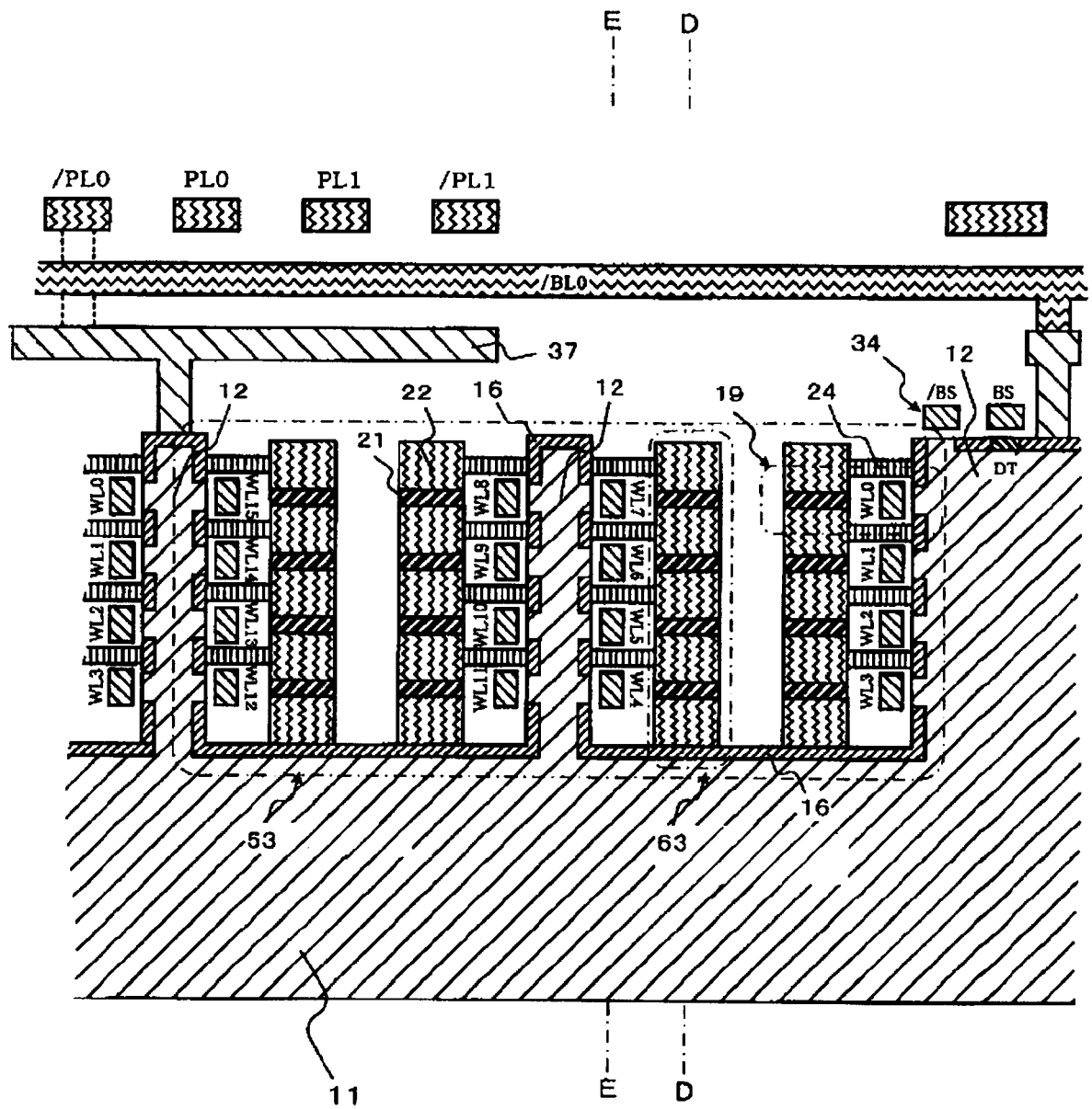

Next, FIG. 15 is a cross-sectional view showing the memory cell portion in the nonvolatile ferroelectric memory according to the fourth embodiment of the present invention. Here, FIG. 14 mainly shows the memory cell block and an interconnection portion related to accessing the memories. In FIG. 15, a portion of the same composition as the first embodiment is attached the same number.

The memory cell portion of the nonvolatile ferroelectric memory according to the fourth embodiment of the present invention includes the plurality of silicon pillars 12. The memory cell portion has a bit line /BL0 disposed over the silicon pillars 12 along orthogonal direction to the word line WL (horizontal direction to the page including FIG. 15), the plate lines PL0, /PL0, PL1 and /PL1 disposed over the bit line /BL0 along the word line WL (perpendicular to the page including FIG. 15), the cell block 13 formed in a space between two of the silicon pillars 12 being adjacent each other, the block-selection transistor 34 and the dummy transistor DT configured to an upper surface of one of the two silicon pillars 12, and the plate contact 37 connected to the diffusion region configured to an upper surface of the other of the two silicon pillars 12.

As a structure and components of main portions mentioned above, except the plane lines PL0, /PL0, PL1 and /PL1, are the same as those of the third embodiment, a detail explanation on the memory cell portion is omitted.

The differences between the fourth embodiment and the third embodiment are that complementary plate lines PL0 and /PL0 are disposed over the bit line (the bit line /BL0 in the case of FIG. 15) instead of the plate lines PL and /PL.

One end of the cell block 13 is connected to the source electrode of the corresponding block-selection transistor 34 as same as the third embodiment. The drain electrode of the other end of the cell transistor 20 in the cell block 13 is connected to the plate line PL0 or /PL0 (/PL0 in the case of FIG. 15) via the PL contact 37 connected to the diffusion region 16 formed on the upper surface of another silicon pillar 12.

As mentioned in FIG. 14, the cell block 13 is connected to plate line PL0 or /PL0 being correspond to the bit line connected to the cell block 13 via the PL contact 37. Accordingly, the PL contact 37 are extended along the bit line so as to overlap the four plate lines PL0, /PL0, PL1 and /PL0, as shown in FIG. 15.

As an interval between the two silicon pillars 12 is 9F per one cell block 13, the size of the memory cell 19 is substantially 1.125F$^2$, as same as the third embodiment.

As the fabricating method of the fourth embodiment is the same as that of the third embodiment, a detail explanation is omitted.

Further according to the fourth embodiment, in addition to the effects described in the third embodiment, as the selected bit line pair BL and /BL in the two sets of the bit line pairs BL and /BL is connected to the sense amplifier 25 in reading operation, the bit line pair BL and /BL being non-select-mode is set at a fixed potential to be able to utilize as a shield line. As a result, the number of the bit line pair BL and /BL in operation at the same time can be decreased to about a half of a conventional memory with reduction of noises between the bit lines. Moreover, consumption power in the bit lines also can be decreased to about a half of a conventional memory with reduction of an area in designing of the sense amplifier 25

Further according to the fourth embodiment, however the cell block has 16 memory cells, the present invention is not limited to a cell block structure. A cell block can be principally constituted of free number of the memory cells.

Fifth Embodiment

FIG. 16 is a cross-sectional view showing the memory cell portion in a nonvolatile ferroelectric memory according to a fifth embodiment of the present invention. Here, FIG. 16 mainly shows the memory cell block and an interconnection portion related to accessing the memories. In FIG. 16, a portion of the same composition as the fourth embodiment is attached the same number.

The memory cell portion of the nonvolatile ferroelectric memory according to the fifth embodiment of the present invention includes the plurality of silicon pillars 12. The memory cell portion has a bit line /BL0 disposed over the silicon pillars 12 along orthogonal direction to the word line WL (horizontal direction to the page including FIG. 16), the plate lines PL0, /PL0, PL1 and /PL1 disposed over the bit line /BL0 along the word line WL (perpendicular to the page including FIG. 15), the cell block 53 formed in a space between two of the silicon pillars 12 being adjacent each other, the block-selection transistor 34 and the dummy transistor DT configured to an upper surface of one of the two silicon pillars 12, and the plate contact 37 connected to the diffusion region configured to an upper surface of the other of the silicon pillars 12.

As the main component portions mentioned above, except the constitution of the cell blocks 53, are the same as the fourth embodiment, a detail explanation is omitted.

The differences in the fifth embodiment with the fourth embodiment are that the cell blocks 53 are constituted of two portions having four blocks stacked in layer as shown in FIG. 16. Each portion has 8 memory cells; the cell structure is the same as the cell block 13 of the fourth embodiment.

These two portions are formed between two spaces being adjacent each other and are connected in series via diffusion regions 16 formed on the upper surface of the silicon pillars 12. A cell capacitor block 63 constituting a cell blocks 53 has four ferroelectric film layers. Four cell transistors 20 are formed on the one sidewall of the silicon pillar 12.

Accordingly, the cell block 53 is the same as the cell block 13 in FIG. 1 as an equivalent circuit. However the cell block 53 is constituted of four columns of the memory cells 19, each of the column having four ferroelectric film layers, as shown in FIG. 16, a substantial size of the memory cell 19 is $2F \times 15/16 \times F$, which is nearly equal to $2F^2$, the size is larger than that of the fourth embodiment.

As the operation of the memory cell portion and fabricating method on the fifth embodiment are the same as those of the fourth embodiment, a detail explanation is omitted.

As the cell capacitor block is constituted of four ferroelectric film layers according to the fifth embodiment, simple processing steps of fabricating the capacitor can realize the memory cell with high packing density. In addition to the effects described in the fourth embodiment, the word lines are formed to enclose the silicon pillars. As the word lines sandwiching the silicon pillars are not necessary to transmit different signals, the structure is realized by simple processing steps.

Further according to the fifth embodiment, as the interval along the bit line direction occupied by the cell block can be configured to wider than that of the fourth embodiment, the layout pitch can be widened. Consequently, an interconnection resistance of the plate line is suppressed to lower level and faster leading of data can be realized.

In the fifth embodiment mentioned above, the cell block 53 is constituted of four columns of the memory cells 19, each of the column having four ferroelectric film layers, however, the invention is not limited to the embodiment. A number of columns and layers can be suitably selected.

Further according to the fifth embodiment, however the equivalent circuit is the same as that of the fourth embodiment, the present invention is not limited to the fifth embodiment. The equivalent circuit can be applied to the first embodiment or the third embodiment.

Sixth Embodiment

Figure 17:
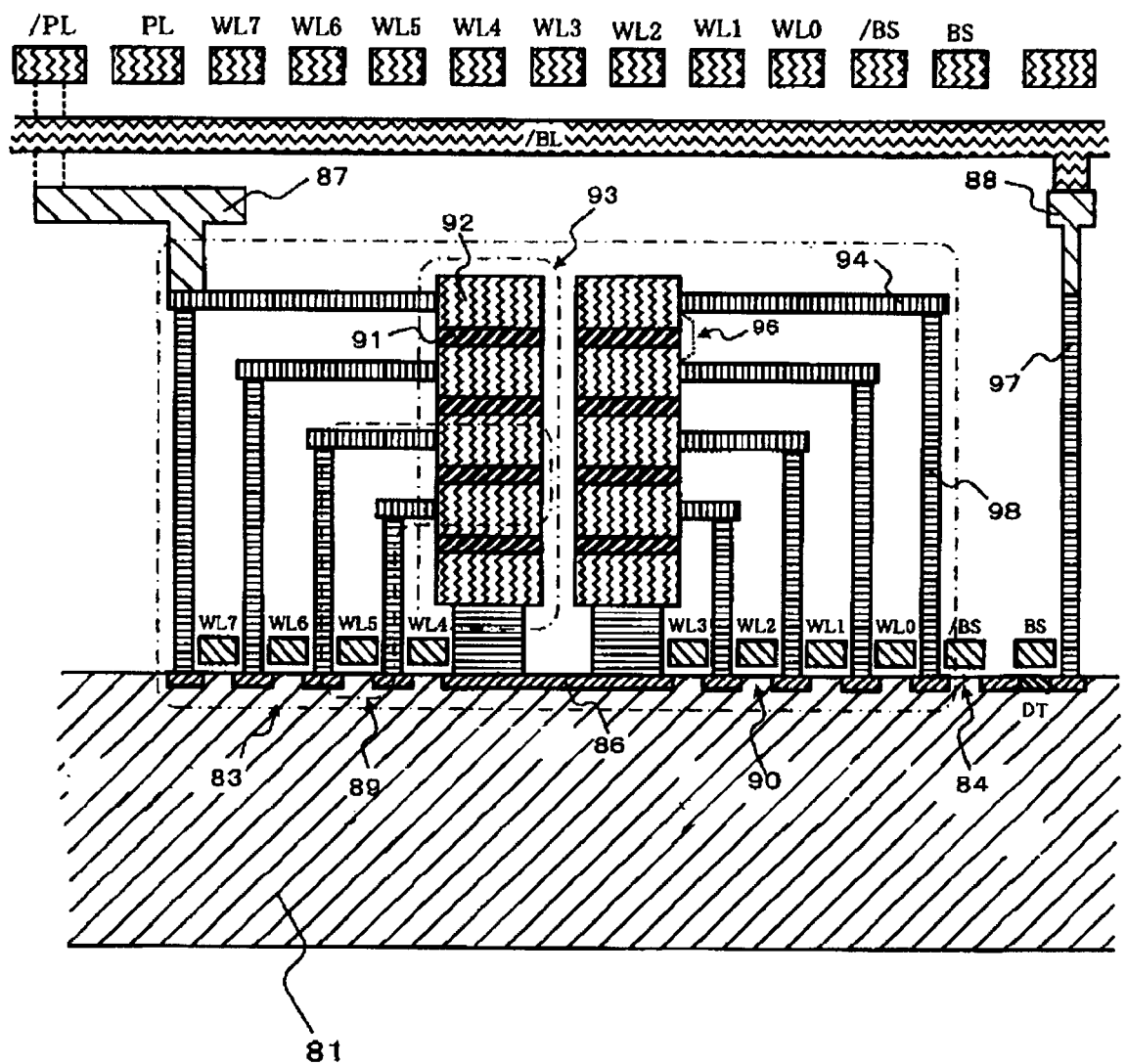
FIG. 17 is a cross-sectional view showing a memory cell portion of a nonvolatile ferroelectric memory according to a sixth embodiment of the present invention.

First, FIG. 17 is a cross-sectional view showing a memory cell portion of a nonvolatile ferroelectric memory according to a sixth embodiment of the present invention. Here, FIG. 17 mainly shows a memory cell block constituted of a plurality of ferroelectric memory cells and an interconnection portion related to accessing the memories.

The memory cell portion of the nonvolatile ferroelectric memory according to the sixth embodiment of the present invention includes a plurality of the silicon pillars 12. The memory cell portion has a memory cell block 83 (a cell block 83) having 8 cell transistors 90, a PL contact 87 and a BL contact 88 disposed over the cell block 83, plate lines PL and /PL disposed over the bit line pair BL and /BL disposed over the PL contact 87 along the word line (perpendicular direction to the page including FIG. 17), low resistance signal lines WL0-WL7, BS and /BS parallel to the plate line, a block-selection transistor 84 adjacent to the cell block 83 disposed on the upper surface of a silicon substrate 81 and the dummy transistor of the block-selection transistor 84.

One end of the cell block 83 is connected to a BL contact plug 97 via the block-selection transistor 84 and the dummy transistor DT being adjacent. The other end of the cell block 83 is electrically connected to the plate line /PL via the PL contact 87.

A BL plug 97 connects between the source electrode of the dummy transistor DT and the BL contact 88. The BL contact 88 is connected to the bit line /BL configured to bit line orthogonal to word line (the horizontal direction to the page including FIG. 17).

The dummy transistor DT is a conventional transistor. The threshold voltage of the dummy transistor DT is maintained to be normally on regardless of the gate electrode voltage. The transistor substantially acts as the diffusion layer interconnection between the drain electrode and the source electrode.

The block-selection transistor 84 connects the cell block 83 to the bit line /BL on a basis of the block-selection signal line BS or /BS. For example, in a case of the cell block 83 as shown in FIG. 17, the block-selection signal line /BS is connected to the block-selection transistor 84 is connected to the gate electrode and the block-selection signal line BS is connected to the gate electrode of the dummy transistor DT. Accordingly, the block-selection signal line /BS at "H" level is connected to the bit line /BL.

On the contrary, the cell block 83 is not connected to the bit line /BL when the block-selection signal line /BS is set at "L" level, namely, the block-selection signal line BS is set at "H" level.

The cell block 83 is constituted of 8 memory cells 89. As shown in FIG. 17, the cell block 83 has the two squire-pole cell capacitor block 93 stacked four ferroelectric films 91 sandwiched by capacitor electrodes 92 in layer, 8 cell transistors formed on both main surfaces of the silicon substrate 81 sandwiching a cell capacitor block 93, each surface of the silicon substrate 81 being formed four cell transistors, and a diffusion region 86 electrically connecting the bottom of the two cell capacitor block 93 and the cell transistors 90 being adjacent to the two cell capacitor block 93.

The two cell capacitor blocks 93 sandwiching an insulator (not illustrated) are formed. In the cell capacitor block 93, a ferroelectric capacitor 96 composed of a ferroelectric film 91 and a capacitor electrode 92 is formed perpendicular to the main surface of the silicon substrate 81.

In the two cell capacitor block 93, 4 ferroelectric capacitors 96 are stacked in layer, respectively. The capacitor electrode 92 is electrically connected to the drain electrode or the source electrode of the cell transistor 90 formed on the main surface of the silicon substrate 81 via a cell contact interconnection 94 and a cell contact plug 98 (CPU plug 98).

The cell contact interconnection 94 is horizontally formed along the bit line from the capacitor electrode 92. The CPU plug 98 is formed perpendicular to the main surface of silicon substrate as connecting the drain electrode or the source electrode of the cell transistor 90 to the cell contact interconnection 94.

The capacitor electrode 92 of the bottom of the cell capacitor block 93 is connected to the diffusion region 86 connecting the two cell transistors adjacent to the cell capacitor block 93.

Two groups of the four cell transistors 90 opposite to each other are respectively formed to sandwich the two cell capacitor blocks 93 along bit line in order. The four the cell transistor 90 share the drain electrode and the source electrode so as to connect in series each other.

As shown in FIG. 17, the cell transistor 90 is formed adjacent to the cell capacitor block 93. The cell transistor 90 and the cell capacitor block 93 are electrically connected via the diffusion region 86 connected to the cell capacitor block 93 so as to connect in series each other.

The gate electrode of the cell transistor 90 is formed as word line WL0-WL7 and is shared by a plurality of the cell block 83 formed perpendicular to the page including FIG. 17. Furthermore, word lines WL0-WL7 are electrically connected to corresponding low resistance interconnections formed over the bit line /BL, respectively.

The sixth embodiment mentioned above is different from the first-fifth embodiments as mentioned below. The cell transistor 90 and the block-selection transistor 84 are formed on the surface of the silicon substrate 81 without forming the silicon pillar 12

Consequently, the cell size is substantially restricted by size of the cell transistor and not restricted by size of the ferroelectric capacitor.

In the sixth embodiment, an equivalent circuit of the memory cell portion is same as the third embodiment except the cell block having the eight memory cell. Furthermore, as the circuit operation is also as same as the third embodiment, detail explanation is omitted.

Furthermore in the sixth embodiment, as the manufacturing method of the memory cell portion is the same as the first embodiment except forming the cell transistor on the main surface of the silicon substrate by a conventional method, detail explanation is omitted.

According to the sixth embodiment, as ferroelectric capacitors are stacked perpendicular direction the main surface of silicon substrate in layer to form the cell block with a three-dimensional structure, the memory cell can be highly integrated.

Further, according to the sixth embodiment, the memory cells composed of one ferroelectric capacitor 96 and one the cell transistor are connected with a plurality of longitudinal columns to constitute the cell block 83. As a result, the memory cell can be highly integrated without degradation of disturb characteristics.

Further, according to the sixth embodiment, the cell transistor is formed on the main surface of the silicon substrate being a bulk, the memory cell portion can be manufactured by a conventional process. Accordingly, the memory cell portion can be highly integrated with retaining high grade of the transistor characteristics as same as conventional characteristics.

Further, according to the sixth embodiment, the dummy transistor is suitably formed below the block-selection signal lines BS and /BS and the two bit line being adjacent each other are constituted as the folded bit line, random accesses with high speed and stable operation can be realized.

Further, according to the sixth embodiment, as cell size is substantially restricted by a size of the cell transistor, size of ferroelectric capacitor 96 can be relaxed.

Further according to the sixth embodiment, however the cell block has 8 memory cells, the present invention is not limited to a cell block structure. A cell block can be principally constituted of free number of the memory cells.

Further, according to the sixth embodiment, however the equivalent circuit is the same as that of the third embodiment, the present invention is not limited to the sixth embodiment.

The equivalent circuit can be applied to the first embodiment as shown in FIG. 6 or the third embodiment as shown in FIG. 14.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the claims that follow. The invention can be carried out by being variously modified within a range not deviated from the gist of the invention. Various modifications will become possible for those skilled in the art after receiving the teachings of the present disclosure without departing from the scope thereof.

What is claimed is:

1. A nonvolatile ferroelectric memory, comprising:
a ferroelectric capacitor having a first electrode, a second electrode and a ferroelectric film sandwiched by said first electrode and said second electrode;
a memory cell transistor having a source electrode connected to said first electrode, a drain electrode connected to said second electrode and a gate electrode connected to a word line and a channel;
a memory cell having said ferroelectric capacitor and said memory cell transistor;
a memory cell block having plural said memory cells, in which each said source and drain electrode are each other connected in series; and
a silicon substrate on which plural memory cell blocks are formed;
wherein said plural channels in said memory cell block are arranged perpendicular to a main surface of said silicon substrate, and a stack of plural ferroelectric films in said memory cell block is arranged perpendicular to said main surface of said silicon substrate.

2. A nonvolatile ferroelectric memory, comprising:
a ferroelectric capacitor having a first electrode, a second electrode and a ferroelectric film sandwiched by said first electrode and said second electrode;
a memory cell transistor having a source electrode connected to said first electrode, a drain electrode connected to said second electrode and a gate electrode connected to a word line and a channel;
a memory cell having said ferroelectric capacitor and said memory cell transistor;
a memory cell block having plural said memory cells, in which each said source and drain electrode are connected to each other in series, one terminal of said memory cell block is connected to a plate line and the other terminal of said memory cell block is connected to a bit line via a block selecting transistor; and
a silicon substrate on which plural memory cell blocks are formed,
wherein said plural channels in said memory cell block are arranged perpendicular to a main surface of said silicon substrate, and a stack of plural ferroelectric films in said memory cell block is arranged perpendicular to said main surface of said silicon substrate.

3. The nonvolatile ferroelectric memory according to claim 2, wherein said plural source electrodes and said plural drain electrodes in said memory cell block are arranged perpendicular to a main surface of said silicon substrate.

4. The nonvolatile ferroelectric memory according to claim 2, wherein said plural word lines in said memory cell block are arranged perpendicular to a main surface of said silicon substrate.

5. The nonvolatile ferroelectric memory according to claim 2, wherein said plural first electrodes and said plural second electrodes in said memory cell block are arranged perpendicular to a main surface of said silicon substrate.

6. The nonvolatile ferroelectric memory according to claim 2, wherein said plural memory cell transistors are formed on silicon pillar formed on said silicon substrate.

7. The nonvolatile ferroelectric memory according to claim 2, wherein said plural first electrodes and said plural second electrodes and said stack of plural ferroelectric films in said memory cell block are arranged perpendicular to a main surface of said silicon substrate.

* * * * *